United States Patent
Uchida et al.

(10) Patent No.: US 9,455,212 B2
(45) Date of Patent: Sep. 27, 2016

(54) LOOP HEAT PIPE SYSTEM AND INFORMATION PROCESSING APPARATUS

(75) Inventors: Hiroki Uchida, Kawasaki (JP); Takeshi Shioga, Kawasaki (JP); Shigenori Aoki, Kawasaki (JP); Susumu Ogata, Kawasaki (JP); Hideaki Nagaoka, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 803 days.

(21) Appl. No.: 13/473,922

(22) Filed: May 17, 2012

(65) Prior Publication Data

US 2012/0227954 A1 Sep. 13, 2012

Related U.S. Application Data

(63) Continuation of application No. PCT/JP2010/058500, filed on May 20, 2010.

(30) Foreign Application Priority Data

Nov. 19, 2009 (JP) ................. 2009-263888

(51) Int. Cl.
| | |
|---|---|
| *F28F 27/00* | (2006.01) |
| *H01L 23/427* | (2006.01) |
| *F28D 15/04* | (2006.01) |
| *F28D 15/06* | (2006.01) |
| *H01L 23/34* | (2006.01) |
| *F28D 15/02* | (2006.01) |

(52) U.S. Cl.
CPC ......... *H01L 23/427* (2013.01); *F28D 15/0266* (2013.01); *F28D 15/043* (2013.01); *F28D 15/06* (2013.01); *H01L 23/345* (2013.01); *H01L 2924/0002* (2013.01)

(58) Field of Classification Search
CPC .... F28D 15/00; F28D 15/02; F28D 15/0266; F28D 15/043; F28D 15/06; F28D 2015/0216
USPC ......... 165/272, 274, 104.21, 104.24, 104.26, 165/104.33
See application file for complete search history.

(56) References Cited

U.S. PATENT DOCUMENTS

| | | | | |
|---|---|---|---|---|
| 3,934,643 A | * | 1/1976 | Laing | 165/272 |
| 4,067,237 A | * | 1/1978 | Arcella | 73/204.23 |
| 4,222,436 A | * | 9/1980 | Pravda | 165/104.21 |

(Continued)

FOREIGN PATENT DOCUMENTS

| | | |
|---|---|---|
| FR | 2755219 | 4/1998 |
| JP | 19779 | 1/1982 |

(Continued)

*Primary Examiner* — Travis Ruby
(74) *Attorney, Agent, or Firm* — Kratz, Quintos & Hanson, LLP

(57) ABSTRACT

A loop heat pipe system includes a loop heat pipe (LHP), a temperature sensor, a heater and a controller. The temperature sensor measures temperature of a working fluid portion of the LHP in which the working fluid has different phases depending on whether or not the LHP is in a disable status not to start up a heat transportation, in which a liquid phase of the working fluid does not exist in an evaporator of the LHP. The heater heats a heating target part of a vapor line. The controller, in order to start up the LHP, turns on the heater, monitors temperature of the heating target part using the temperature sensor, and turns off the heater when detecting a change in the monitored temperature, caused by condensation of a vapor phase of the working fluid.

13 Claims, 29 Drawing Sheets

(56) References Cited

U.S. PATENT DOCUMENTS

| | | | |
|---|---|---|---|
| 4,370,547 A * | 1/1983 | Ward | 219/497 |
| 4,765,396 A | 8/1988 | Seidenberg | 165/104.26 |
| 4,898,231 A | 2/1990 | Miyazaki | 165/13 |
| 5,289,869 A * | 3/1994 | Klein et al. | 165/273 |
| 7,004,240 B1 | 2/2006 | Kroliczek et al. | 165/104.26 |
| 7,061,446 B1 * | 6/2006 | Short et al. | 343/893 |
| 7,931,072 B1 | 4/2011 | Kroliczek et al. | 165/104.26 |
| 8,047,268 B1 | 11/2011 | Kroliczek et al. | 165/104.26 |
| 2002/0007937 A1 | 1/2002 | Kroliczek et al. | 165/104.26 |
| 2003/0205364 A1 | 11/2003 | Sauciuc et al. | 165/104.25 |
| 2004/0182550 A1 | 9/2004 | Kroliczek et al. | 165/104.26 |
| 2004/0206479 A1 | 10/2004 | Kroliczek et al. | 165/104.21 |
| 2005/0061487 A1 | 3/2005 | Kroliczek et al. | 165/139 |
| 2005/0166399 A1 | 8/2005 | Kroliczek et al. | 29/890.07 |
| 2009/0200006 A1 | 8/2009 | Kroliczek et al. | 165/274 |
| 2010/0051254 A1 * | 3/2010 | Ipposhi et al. | 165/274 |
| 2010/0101762 A1 | 4/2010 | Kroliczek et al. | 165/104.26 |
| 2012/0017625 A1 | 1/2012 | Kroliczek et al. | 62/335 |
| 2012/0024497 A1 | 2/2012 | Kroliczek et al. | 165/104.13 |

FOREIGN PATENT DOCUMENTS

| | | |
|---|---|---|
| JP | 1982-19779 | 2/1982 |
| JP | 62-284191 | 12/1987 |
| JP | 08-285484 | 11/1996 |
| JP | 2002-174492 | 6/2002 |
| JP | 2002-340489 | 11/2002 |
| JP | 2006-508324 | 3/2006 |
| JP | 2009-115396 | 5/2009 |
| JP | 2009-168273 | 7/2009 |

* cited by examiner

LOOP HEAT PIPE SYSTEM AND INFORMATION PROCESSING APPARATUS

CROSS-REFERENCE TO RELATED APPLICATIONS

This is a continuation application of and claims priority to International Patent Application No. PCT/JP2010/058500, filed on May 20, 2010, which claims priority to Japanese Patent Application No. 2009-263888 filed on Nov. 19, 2009 and designates the U.S., the entire contents of which are incorporated herein by reference.

FIELD

The present invention relates to a loop heat pipe system and an information processing apparatus having a loop heat pipe.

BACKGROUND

As a device for cooling various heat sources, there has been known an loop heat pipe that includes an evaporator to evaporate working liquid (a liquid phase of a working fluid) by adsorbing heat from a heat source, a condenser to condense vaporized working liquid (vapor phase of a working fluid?) by radiating heat, and a vapor line and a liquid line each connecting the evaporator with the condenser to form a closed loop.

The loop heat pipe is, in principle, a device that does not start up (a device that does not start to serve as a heat transport device; a device, circulation of the working fluid within which is not started) in situations where working liquid does not exists in the evaporator, even if the temperature of the evaporator rises owing to the temperature rise of the heat source. The loop heat pipe is therefore usually configured (installed in an apparatus) so that the height (vertical position) of the evaporator becomes lower than that of the condenser. However, among apparatuses into which the loop heat pipes are installed, there is an apparatus requiring that the evaporator occupies a higher position than the condenser.

Therefore, in order to enable the loop heat pipe having the configuration where the evaporator is located below the condenser to start up, it is proposed to attach a heater to part of the vapor line (a part of the vapor line near the evaporator) and to heat, by using the heater, the part of the vapor line during a prescribed time before activating a heat source (a cooling target).

With a contrivance that enables part of the vapor line to be heated before activating the heat source (when needed to start the loop heat pipe), it is possible to start, the loop heat pipe that is in situations where there exists no working liquid in the evaporator.

However, distribution profiles of the working liquid in the loop heat pipe vary according to the elapsed time after stopping the cooling target, even if the positional relationship between the evaporator and the condenser remains unchanged. Moreover, in the loop heat pipe built into a portable information processing apparatus (a notebook PC (Personal Computer) and the like), distribution profiles of the working fluid vary according to its attitudes while the portable information processing apparatus is carried and/or used. Further, there are cases where heating of the vapor line in short line allows the loop heat pipe to start up, depending on the distribution profile of the working fluid in the loop heat pipe. Consequently, if the heating time of the vapor line is fixed, there arise problems wherein energy more than needed is consumed by heating of the vapor line, the start timing of the cooling target is overdue more than needed, and so on.

PRIOR ART DOCUMENTS

Patent document 1: U.S. Pat. No. 4,765,396
Patent document 2: Japanese Laid-open Patent Publication No. 2002-174492
Patent document 3: Japanese Laid-open Patent Publication No. 08-285484
Patent document 4 Japanese Laid-open Patent Publication No. 2002-340439
Patent document 5 Japanese Laid-open Patent Publication No. 2009-115396
Patent document 6: Japanese Laid-open Patent Publication No. 2009-168273
Patent document 7 Japanese National Publication of International Patent Application No. 2006-508324
Patent document 8: Japanese Laid-open Patent Publication No. 62-284191

SUMMARY

According to an aspect of the embodiments, a loop heat pipe system includes:

a loop heat pipe including an evaporator to evaporate a liquid phase of a working fluid by adsorbing heat from a heat source, a condenser to condense a gas phase of the working fluid by radiating heat, a vapor line to feed the working fluid from the evaporator to the condenser, and a liquid line to feed the working fluid from the condenser to the evaporator;

a temperature sensor to measure temperature of part of the loop heat pipe, a working fluid portion in which has different phases in a first situation where the loop heat pipe functions as a heat transport device and in a second situation where the loop heat pipe does not function as a heat transport device and a liquid phase of the working fluid does not exist in the evaporator;

a heater to heat a heating target part that is part of the vapor line; and a controller, in order to start the loop heat pipe that is in a situation where temperature rise of the evaporator does not cause the loop heat pipe to start functioning as a heat transport device, to turn on the heater, to monitor temperature of the heating target part using the temperature sensor, and to turn off the heater when detecting a change caused by condensation of a gas phase of the working fluid in the monitored temperature.

According to another aspect of the embodiments, a loop heat pipe system includes:

a loop heat pipe including an evaporator to evaporate a liquid phase of a working fluid by adsorbing heat from a heat source, a condenser to condense a gas phase of the working fluid by radiating heat, a liquid line to feed the working fluid from the condenser to the evaporator, and a vapor line including a main line whose open end is connected to the condenser and multiple branch lines, branched off from the main line, whose open ends are connected to the evaporator; and a heater to heat one or more branch lines among the multiple branch lines of the loop heat pipe.

According to still another aspect of the embodiments, an information processing apparatus includes:

an electronic component to be cooled in operation a loop heat pipe including an evaporator to evaporate a liquid phase of a working fluid by adsorbing heat from the electronic component, a condenser to condense a gas phase of the working fluid by radiating heat, a vapor line to feed the working fluid from the evaporator to the condenser, and a liquid line to feed the working fluid from the condenser to the evaporator;

a temperature sensor to measure temperature of part of the loop heat pipe, a working fluid portion in which has different phases in a first situation where the loop heat pipe functions as a heat transport device and in a second situation where the loop heat pipe does not function as the heat transport device and a liquid phase of the working fluid does not exist in the evaporator;

a heater to heat a heating target part that is part of the vapor line; and a controller, in order to start the loop heat pipe that is in a situation where temperature rise of the evaporator does not cause the loop heat pipe to start functioning as a heat transport device, to turn on the heater, to monitor temperature of the heating target part using the temperature sensor, and to turn off the heater when detecting a change caused by condensation of a gas phase of the working fluid in the monitored temperature.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 13 is an explanatory diagram illustrating contents of control that a control device performs to a CPU and the heating device before performing a completion-of-startup monitoring process.

DESCRIPTION OF EMBODIMENTS

Four types of information processing apparatuses developed by inventors (hereinafter referred to as information processing apparatuses according to first through fourth embodiments) will hereinafter be described with reference to the accompanying drawings.

First Embodiment

First of all, configuration of the information processing apparatus 1 according to the first embodiment will be explained referring to FIGS. 1 through 4.

Figure 1:
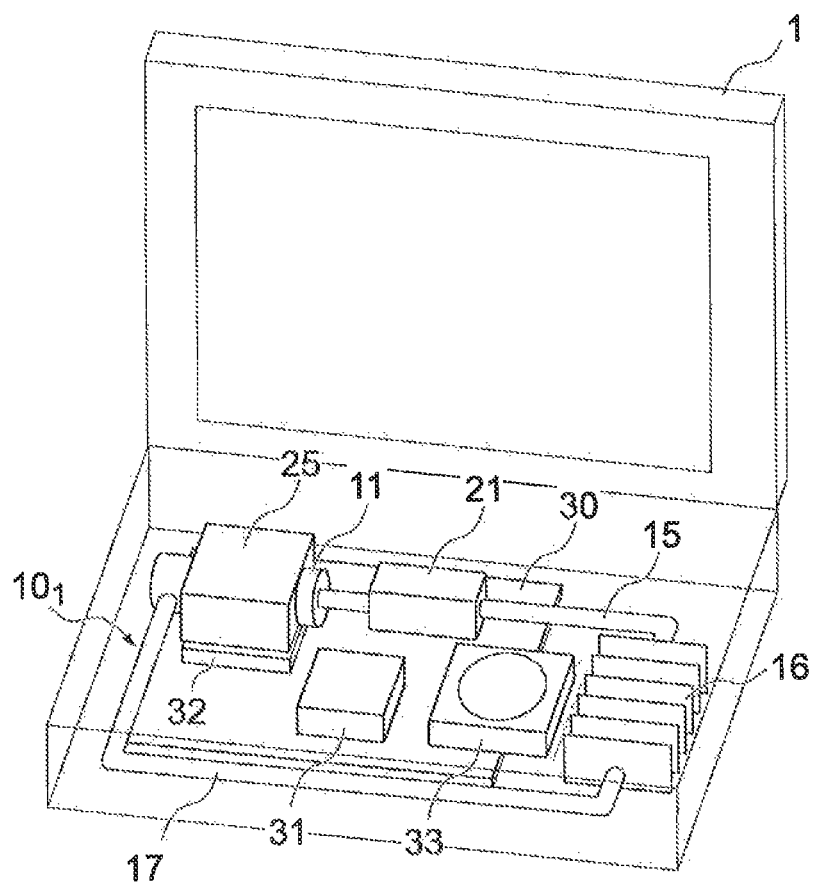
FIG. 1 is a block diagram illustrating an information processing apparatus according to a first embodiment.

As schematically illustrated in FIG. 1, the information processing apparatus 1 is a so-called notebook PC, and includes a printed circuit board 30, a loop heat pipe $10_1$, etc.

The printed circuit board 30 is a printed wiring board on which components such as a CPU 32 (in this embodiment, a CPU whose maximum calorific value is 80 W) are mounted.

The loop heat pipe (referred to in the following as the LHP) $10_1$ is a heat transport device that includes an evaporator 11, a condenser 16, and a vapor line 15 and a liquid line 17 each connecting the evaporator 11 with the condenser 16 to form a closed loop. The LHP $10_1$ also includes a predetermined amount of a working fluid (water, alternative CFCs, etc.) enclosed therein.

The evaporator 11 is a unit to evaporate a liquid phase of the working fluid (which will hereinafter called a working liquid) therein by adsorbing heat from the CPU 32.

Figure 2:
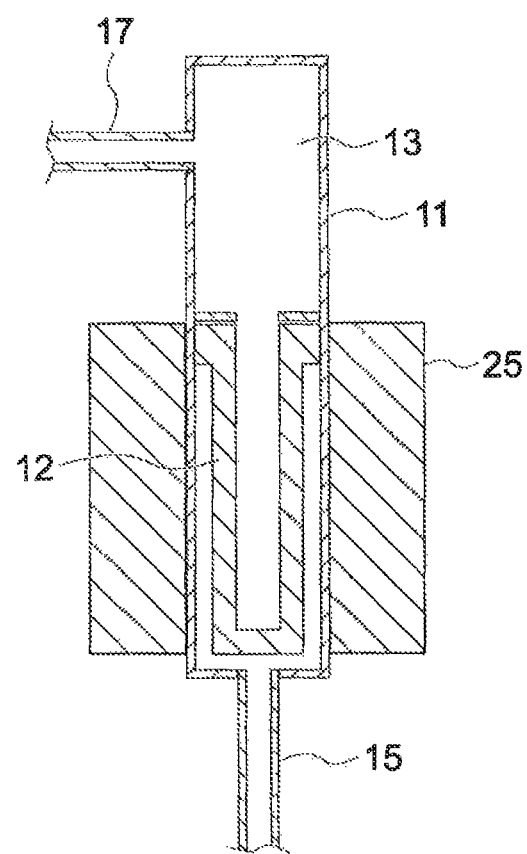
FIG. 2 is an explanatory diagram illustrating an evaporator provided in a loop heat pipe of the information processing apparatus according to the first embodiment.

The LHP 10 employs, as the evaporator 11, a device having a configuration represented in FIG. 2. Namely, the LHP $10_1$ employs the evaporator 11 provided with a body part having an enclosed wick 12 to evaporate working liquid therein, and the reservoir 13 to temporarily reserve working liquid.

The body part (FIG. 1) of the evaporator 11 is in thermal contact with the CPU 32 through a heat-receiving block that is made from a high thermal conductivity material (in this embodiment, copper). Further, the information processing apparatus 1 is configured so that the evaporator 11 and the condenser 16 are positioned almost level when the apparatus is used in the usual manner (when the apparatus is not intentionally tilted).

Figure 3:
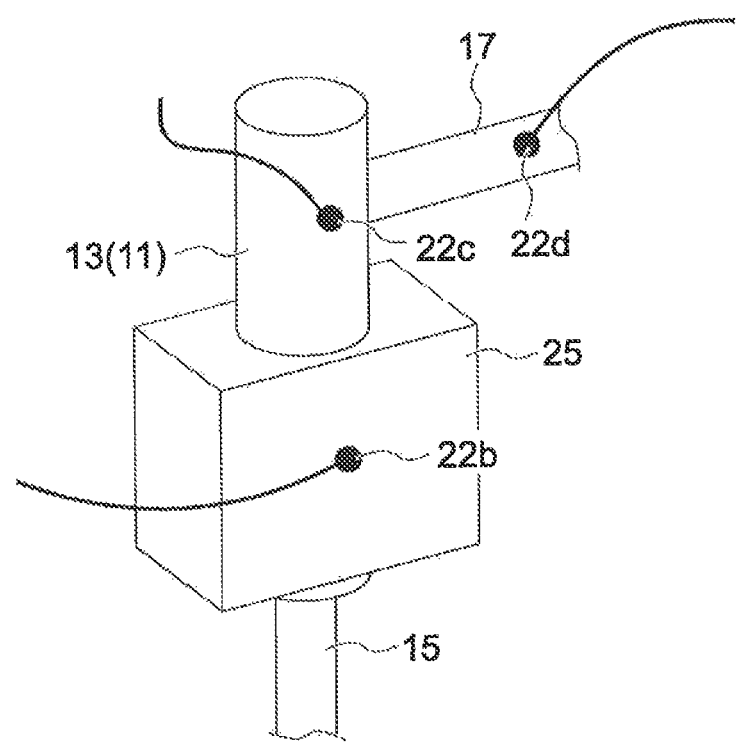
FIG. 3 is an explanatory diagram illustrating an attachment position of a temperature sensor near the evaporator in the information processing apparatus according to the first embodiment.

As illustrated in FIG. 3, to the evaporator 11, a temperature sensor 22c (a thermoelectric couple; each of other temperature sensors described later is also a thermoelectric couple) for measuring temperature of the reservoir 13 is attached. Moreover, to the surface of the heat-receiving block 25 that is in contact with the CPU 32, a temperature sensor 22b for measuring temperature of the body part of the evaporator 11 (temperature of the CPU 32) is attached. Furthermore, to a part of the liquid line 17 near the evaporator 11 (in the present embodiment, a part located 30 mm apart from the end of the liquid line 17 connected to the evaporator 11), a temperature sensor 22d for measuring temperature of the part concerned is attached.

The condenser 16 (FIG. 1) is a unit to condense a working fluid portion that is vaporized (evaporated) in the evaporator 11 and is fed through the vapor line 15 by radiating heat. The condenser 16 consists of a meander pipe (not illustrated; denoted hereinafter as a condensation line) and multiple radiating fins fixed to the pipe. Further, a fan 33 for carrying out air-cooling of this condenser 16 is installed in the information processing apparatus 1.

Incidentally, each of the condensation line, the vapor line 15 and the liquid line 17 of the LHP $10_1$ in the information processing apparatus 1 is about 200 mm in length. Moreover, LHP $10_1$ employs, as each line, a copper pipe having an outside diameter of 4 mm and an inside diameter of 3 mm, and employs, as the evaporator 11, a device including the body part whose dimension (outer dimension) is about $\phi$ 15 mm×60 mm and the reservoir 13 whose dimensions is about $\phi$ 15 mm×50 mm.

Figure 4:
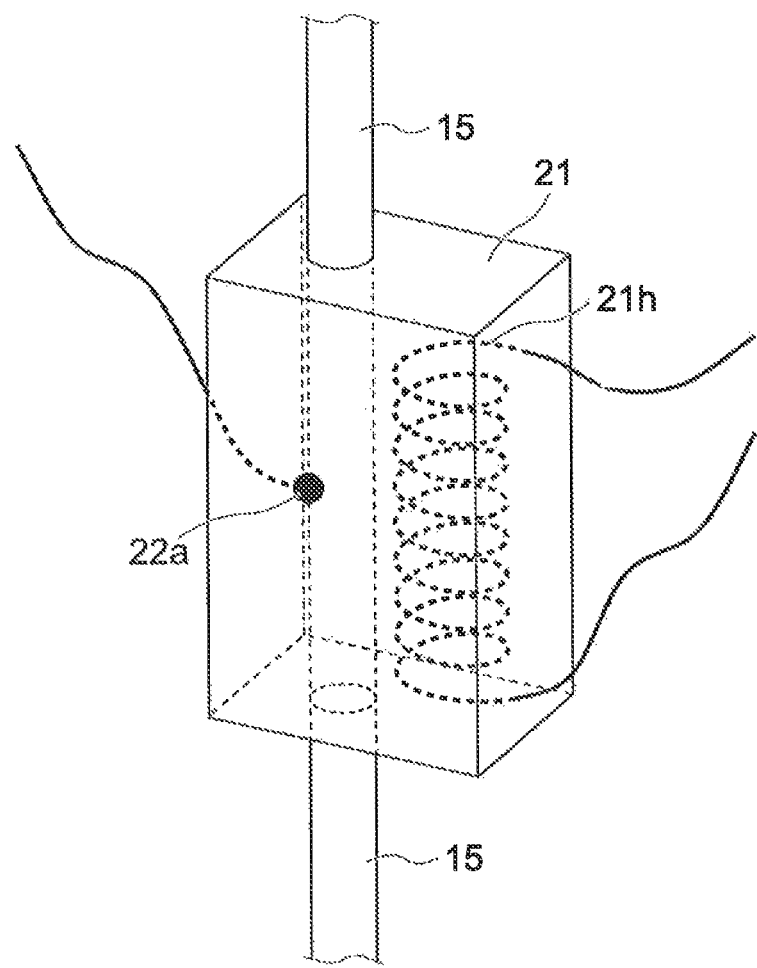
FIG. 4 is an explanatory diagram illustrating a heating device attached to a vapor line of the loop heat pipe in the information processing apparatus according to the first embodiment.

To an intermediate part (which will be explained in details later on) of the vapor line 15 of the LHP $10_1$, a heating device 21 to heat the vapor line 15 is attached. As illustrated in FIG. 4, this heating device 21 is a unit including a member made of a high thermal conductive material (in this embodiment, a member which is made of copper and the length of which in the direction of the length of the vapor line 15 is about 50 mm) and a heater 21h (an electrically heated wire) embedded in the member. Further, as depicted in the same figure, to the part of the vapor line 15 to which the heating device 21 is attached, the temperature sensor 22a for measuring temperature of the part (hereinafter referred to as the heating target part) is attached.

On the printed circuit board 30 of the information processing apparatus 1 (FIG. 1), a control device 31 (in this embodiment, a relatively less capable microcontroller including an A/D converter etc.) is mounted. The control device 31 is electrically connected with the heating device 21 and the temperature sensors 22a through 22d mentioned above. Moreover the printed circuit board 30 is configured (designed) so that the control device 31 is able to start/stop the CPU 32.

Based on the premise of what has been described so far, the configuration and the operation of the information processing apparatus 1 according to the first embodiment will be specifically explained. Note that, in the following discussion, temperatures measured by the temperature sensors 22a, 22b 22c and 22d will be termed Ta, Tb, Tc and Td, respectively.

Figure 5:
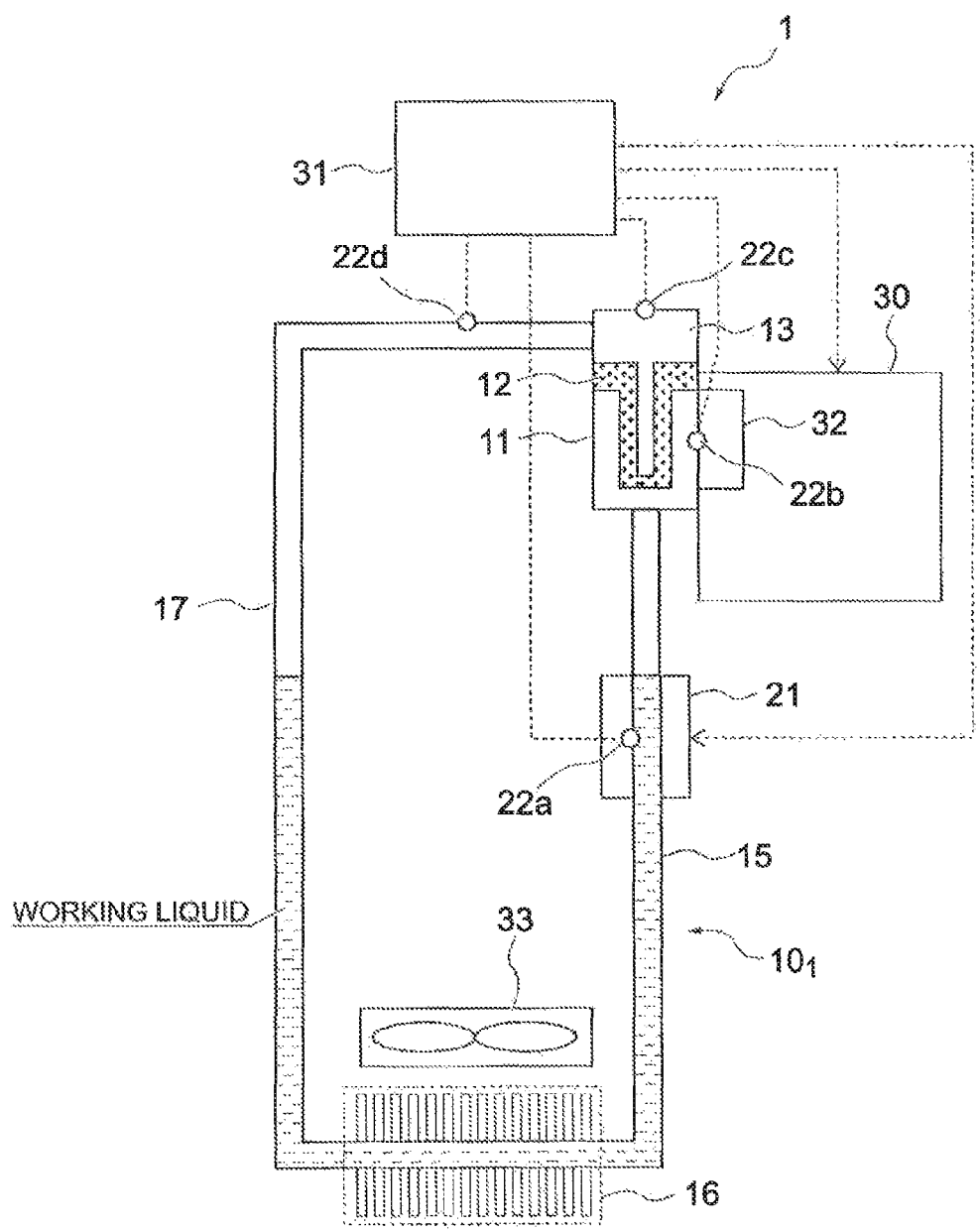
FIG. 5 is a simplified block diagram illustrating the information processing apparatus according to the first embodiment.

The attachment position of the heating device 21 (refer to FIG. 4) to the vapor line 15 is determined so that the condition schematically illustrated in FIG. 5 is achieved when all the working fluid is gathered on the condenser-side (the side including the condenser 16) of the LHP $10_1$ by turning the condenser 16 vertically down. That is, the heating device 21 of the information processing apparatus 1 is attached to the vapor line 15 so that the position of the evaporator-side surface of the heating device 21 roughly matches with the position of the surface of the working liquid in the vapor line 15 that is gathered on the condenser-side within the LHP $10_1$.

Figure 6:
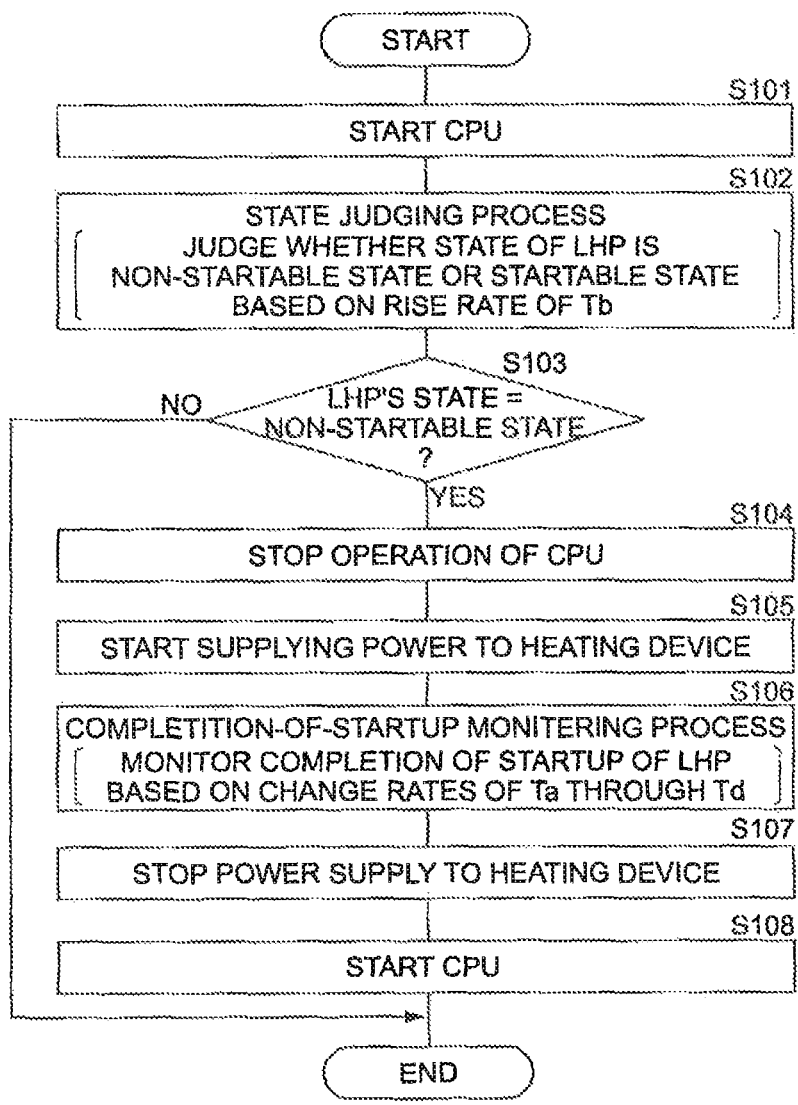
FIG. 6 is a flowchart of an activating process performed by a control device in the information processing apparatus according to the first embodiment.

Moreover, the control device 31 of the information processing apparatus 1 is configured (programmed) so as to start an activating process in steps illustrated in FIG. 6 when the information processing apparatus 1 is started (when an unillustrated power switch of the information processing apparatus 1 is turned to the ON position).

Namely, when the information processing apparatus 1 is started, the control device 31 at first performs a process of starting the CPU 32 (step S101). The process that the control device 31 actually performs at step S101 is a process of controlling (switching on) a semiconductor switch for turning on and off the power supply from a power unit in the information processing apparatus 1 to the main part (almost all part except the control device 31) of the printed circuit board 30.

Subsequently, the control device 31 performs a state judging process (step S102) of judging, based on a increase ratio of Tb (temperature of the body part of the evaporator 11 measured by the temperature sensor 22b), whether the state of the LHP 101 is a startable state defined as a state where a temperature rise of the body part of the evaporator 11 causes no circulation of the working fluid in the LHP $10_1$ or a non-startable state defined as a state other than the startable state.

The state judging process is a process that monitors an occurrence of an event that a set time is elapsed and an occurrence of an event that Tb becomes equal to or higher than a set temperature, and judges, when Tb becomes equal to or higher than the set temperature before the set time is elapsed, that the state of the LHP $10_1$ is the non-startable state, and finishes execution. Furthermore, the state judging process is also a process that judges, when the set time is elapsed before Tb becomes equal to or higher than the set temperature, that the state of the LHP $10_1$ is the startable state, and finishes execution. Note that the set time and the set temperature are the values that are predetermined so that whether the state of the LHP $10_1$ is the startable state or the non-startable state can be judged by the state judging process of the above-mentioned steps/contents. Moreover, these values of the information processing apparatus 1 according to this embodiment are determined from measurement results of Tb change pattern (profile) of "the information processing apparatus 1 whose LHP $10_1$ is in the state where working liquid does not exist in the evaporator 11" (the information processing apparatus 1 started without executing the activating process) and measurement results of Tb change pattern of "the information processing apparatus 1 whose LHP $10_1$ is in the state where working liquid exists in the evaporator 11."

The control device 31 having finished the state judging process, if the state of the LHP $10_1$ is judged to be the startable state by the state judging process (step S103; NO), terminates the activating process (the process whose procedures are represented in FIG. 6) without performing any particular process.

Whereas if the state of the LHP 101 is judged to be the non-startable state by the state judging process (step S103; YES), the control device 31 performs a process of stopping the operation of the CPU 32 (step S104). More specifically, at step S104, the control device 31 performs a process of making the CPU 32 execute a process that the CPU 32 executes at the time when the information processing apparatus 1 is shut down.

After finishing the process of step S104, the control device 31 starts supplying power to the heating device 21 (the heater 21h) (step S105). Thereafter, the control device 31 starts a completion-of-startup monitoring process (step S106) that is a process of watching (waiting) for completion of the startup of the LHP $10_1$ (completion of state transition to the startable state) based on change ratios of Ta through Td.

In advance of a detailed discussion on the completion-of-startup monitoring process, referring to FIGS. 7 and 8, phenomena that occur when the heating target part of the vapor line 15 of the LHP $10_1$ in the non-startable state will be explained.

An assumption is that heating of the heating target part of the vapor line 15 is started at a time t0, under the conditions that working liquid exists only on the condenser-side in the LHP $10_1$ (refer to FIG. 5) and the CPU 32 does not operate.

Figure 7:
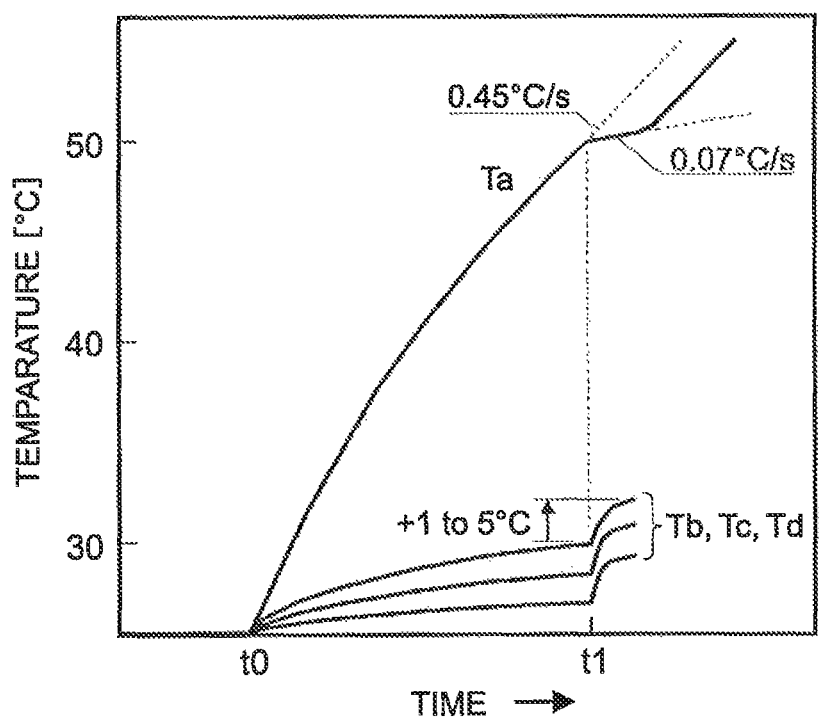
FIG. 7 is an explanatory diagram illustrating changes in temperature of each part of the loop heat pipe when a heating target part of the vapor line is heated.
Figure 8:
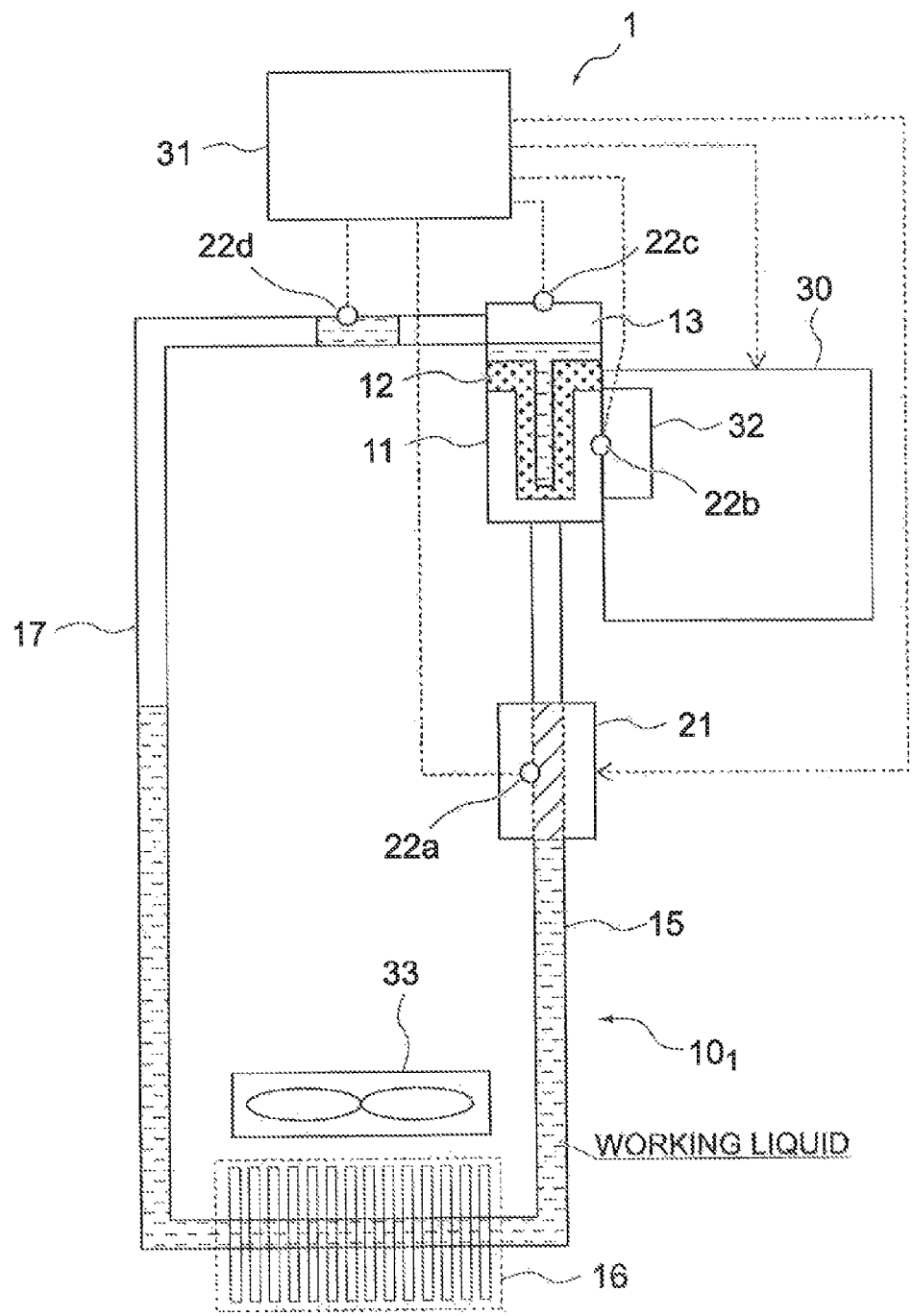
FIG. 8 is an explanatory diagram illustrating the status of the working fluid in the loop heat pipe when a certain time passes after heating of the heating target part of the vapor line is started.

In this case, as illustrated in FIG. 7, it follows that the temperature Ta of the heating target part rises at the speed corresponding to the calorific value of the heating device 21. Moreover, each of the temperatures Tb though Td for the parts apart from the heating target part rises at a slower speed. Note that each temperature illustrated in FIG. 7 is the actual measurement result obtained by activating the heating device 21 after gathering all the working liquid on the condenser-side within the LHP $10_1$ by turning the condenser 16 vertically down.

When the temperature Ta of the heating target part rises, the working liquid in the heating target part evaporates to increase the pressure in the heating target part. Therefore, the pressure in the parts other than the heating target part also increase, which causes condensation of the working fluid in vapor phase within the parts having a relatively low temperature.

Moreover, when the working liquid in the heating target part evaporates, the evaporated working fluid, i.e., vapor, having a high temperature will flow toward the evaporator 11 having a low temperature, and thereby the evaporated working fluid is condensed into liquid. Consequently, as schematically illustrated in FIG. 8, when Ta rises to some level, the working fluid in vapor phase is condensed into liquid within the evaporator 11 and/or the parts of the liquid line 17 near the evaporator 11.

Since heat is evolved when the working fluid vapor condenses into liquid, if the working fluid vapor condenses at a certain time t1, the temperatures Tb through Td of the parts in which the working fluid vapor condense will rise by about 1 to 5° C. owing to the evolved heat as illustrated in FIG. 7.

Moreover, when the working fluid vapor condenses, the pressure in each part decreases rapidly. Therefore (since temperature is lowered when a pressure decreases obeying the ideal gas equation PV=nRT), the increase ratio of the temperature Ta of the heating target part is lowered (0.45° C./sec→0.07° C./sec in the information processing apparatus 1).

Thus, heating the heating target part of the vapor line 15 of the LHP $10_1$ in the non-startable state enables the LHP $10_1$ to go into the state where the working fluid liquid exists in the evaporator 11 (i.e., the startable state). Moreover, when the state of the LHP $10_1$ goes into the startable state, a characteristic temperature change (change of the change ratio of the temperature) occurs in each part of the LHP $10_1$.

The completion-of-startup monitoring process (FIG. 6: step S106) that the control device 31 performs is a process of monitoring occurrence of such a characteristic temperature change at one of the parts to which the temperature sensors 22a through 22d are attached.

More specifically, the completion-of-startup monitoring process is a process that monitors, as to Ta, that the condition: "temperature-rise width per second falls not less than 30%" is satisfied, and monitors, as to each of the temperatures Tb through Td, that the condition: "temperature changes more than 1° C. in 5 seconds" is satisfied.

Figure 9:
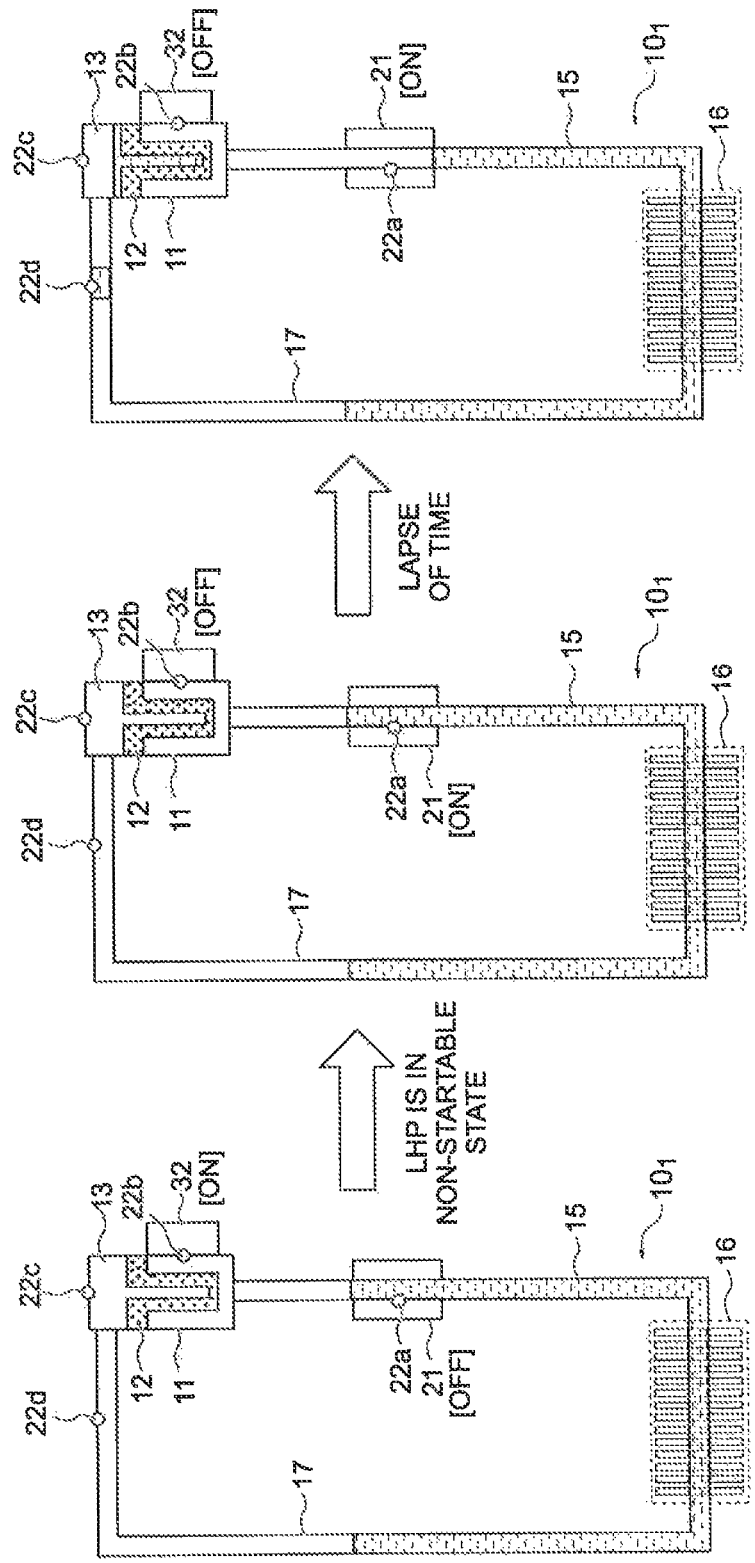
FIG. 9 is an explanatory diagram illustrating contents of control that the control device performs to a CPU and the heating device before performing a completion-of-startup monitoring process.

Note that, as illustrated in FIG. 9, the control device 31 is a device that stops the operation of the CPU 32 and makes the heating device 21 function when judging that the state of the LHP $10_1$ in the information processing apparatus 1, the CPU 32 in which is already started, is the startable state (refer to steps S101 through S105). That is, the control device 31 is a device that starts heating of the heating target part of the vapor line 15 in situations where Tb is high. Each condition mentioned above is therefore determined not from the measurement results of the temperatures represented in FIG. 7, but from "the measurement results of the temperatures Ta through Td obtained by stopping the operation of the CPU 32 and then making the heating device 21 function after raising Tb to a preset temperature."

The control device 31 finishing the completion-of-startup monitoring process (FIG. 6, step S106) stops supplying power to the heating device 21 (step S107), and then starts (restarts) the CPU 32 (step S108). Thereafter, the control device 31 terminates the activating process.

As is clear from the discussion given above, the information processing apparatus 1 (the control device 31) according to the present embodiment, when making the heating device 21 operate in order to start the LHP $10_1$ in the non-startable state, monitors that the state of the LHP $10_1$ goes into the startable state based on the temperature change pattern of the part of the liquid line 17 near the evaporator 11, etc., and stops the operation of the heating device 21 when the state of the LHP $10_1$ goes into the startable state.

Therefore, this information processing apparatus 1 functions as an apparatus that can start the LHP $10_1$ in the non-startable state efficiently (in a way that can prevent energy more than needed from being consumed by heating of the vapor line and/or the start timing of the cooling target from being overdue more than needed)

Second Embodiment

A configuration and an operation of the information processing apparatus 1 according to the second embodiment will be explained in a way that puts a focus on differences from the information processing apparatus 1 according to the second embodiment.

Figure 10:
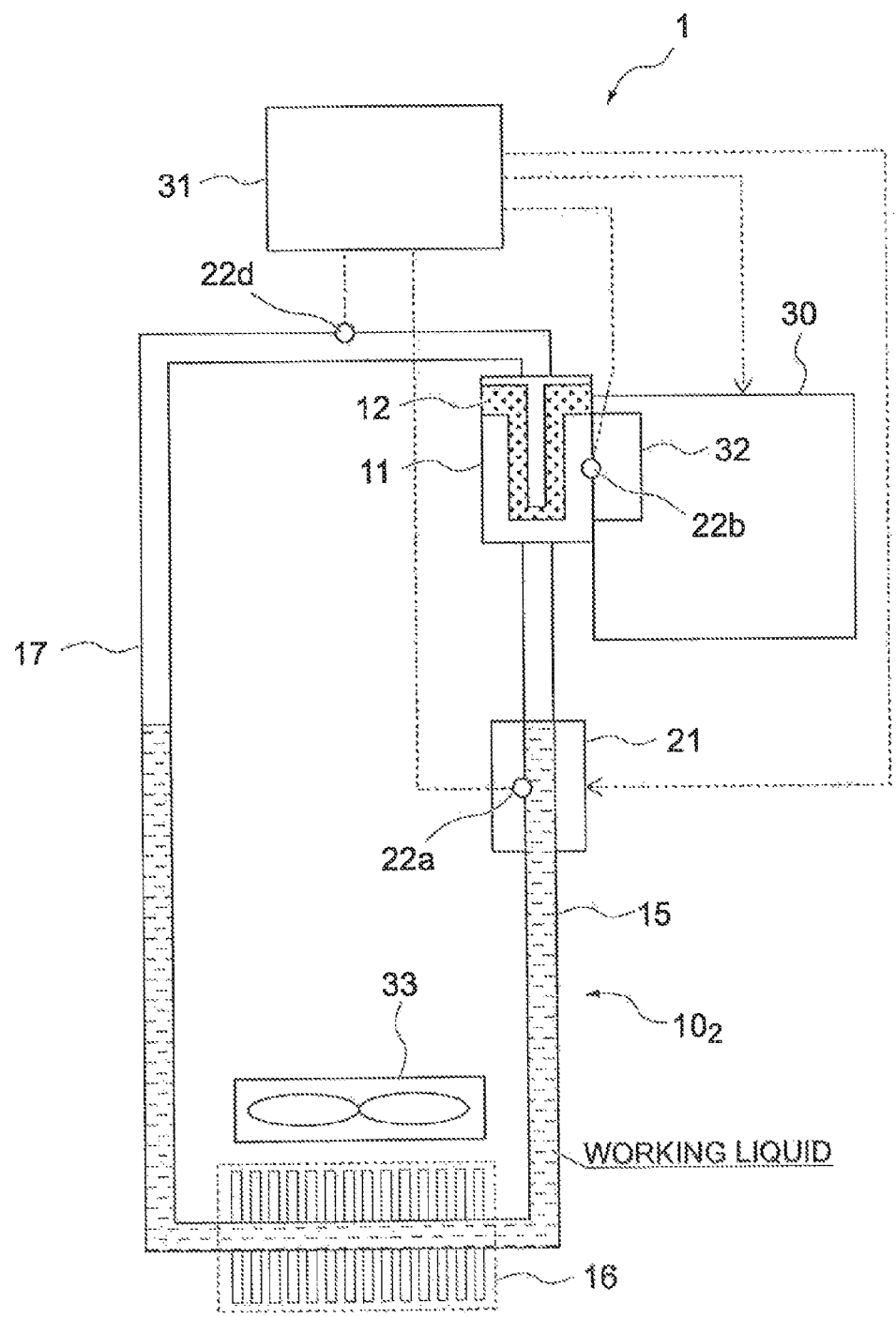
FIG. 10 is a simplified block diagram illustrating an information processing apparatus according to a second embodiment.

As schematically illustrated in FIG. 10, the information processing apparatus 1 according to the second embodiment is an apparatus that includes an LHP (loop heat pipe) $10_2$ for cooling the CPU 32, the heating device 21, the control device 31, etc.

This information processing apparatus 1 (which will hereinafter also be termed the second information processing apparatus 1) is, similar to the information processing apparatus 1 according to the first embodiment (which will hereinafter also be termed the first information processing apparatus 1), a so-called notebook PC.

Figure 11:
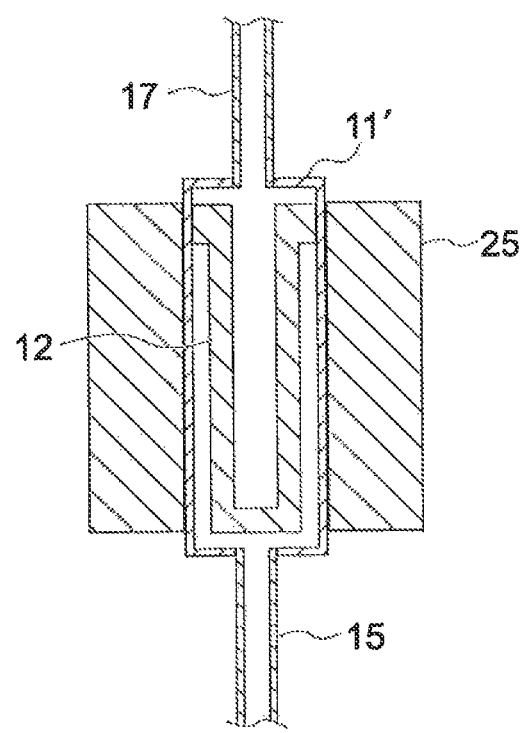
FIG. 11 is an explanatory diagram illustrating an evaporator in a loop heat pipe equipped in the information processing apparatus according to the second embodiment.

The LHP $10_2$ is an LHP equipped with an evaporator 11' depicted in FIG. 11 (and FIG. 10), i.e., the evaporator 11' that does not include the reservoir 13.

Figure 12:
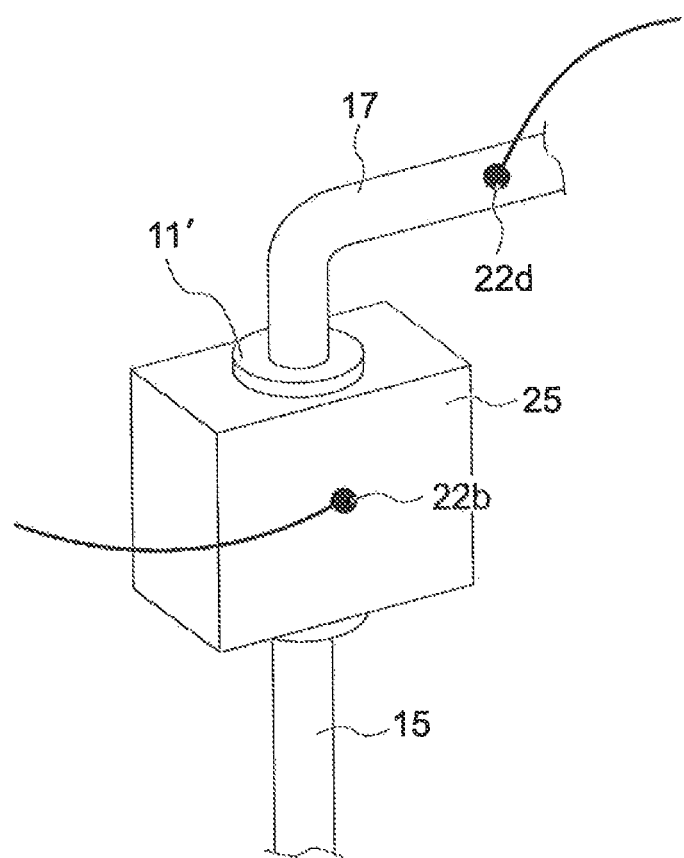
FIG. 12 is an explanatory diagram illustrating an attachment position of a temperature sensor near the evaporator of the information processing apparatus according to the second embodiment.

Further, the second information processing apparatus 1, as illustrated in FIG. 12, is fabricated without attaching a sensor corresponding to the temperature sensor 22c (refer to FIG. 3) to the evaporator 11'. Moreover, on the printed circuit board 30 in the second information processing apparatus 1, a device that is different from the above-mentioned control device 31 only in that monitoring of Tc is not performed in the completion-of-startup monitoring process is mounted as the control device 31.

In short, the second information processing apparatus 1 has a configuration obtainable by replacing the evaporator 11 in the first information processing apparatus 1 with the evaporator 11' and removing from the first information processing apparatus 1 components and facility that are no longer needed as a result of the replacing.

Here, even if Tc cannot be measured, so long as Ta, etc. can be measured, it is possible to detect that the state of the LHP $10_2$ goes into the startable state. Consequently, it can be said that the information processing apparatus 1 according to the second embodiment also functions as an apparatus that is able to start the LHP $10_2$ in the non-startable state efficiently.

Third Embodiment

A configuration and an operation of the information processing apparatus 1 according to the third embodiment (which will hereinafter also be termed the third information processing apparatus 1) with reference to FIGS. 13 through 21.

Figure 13:
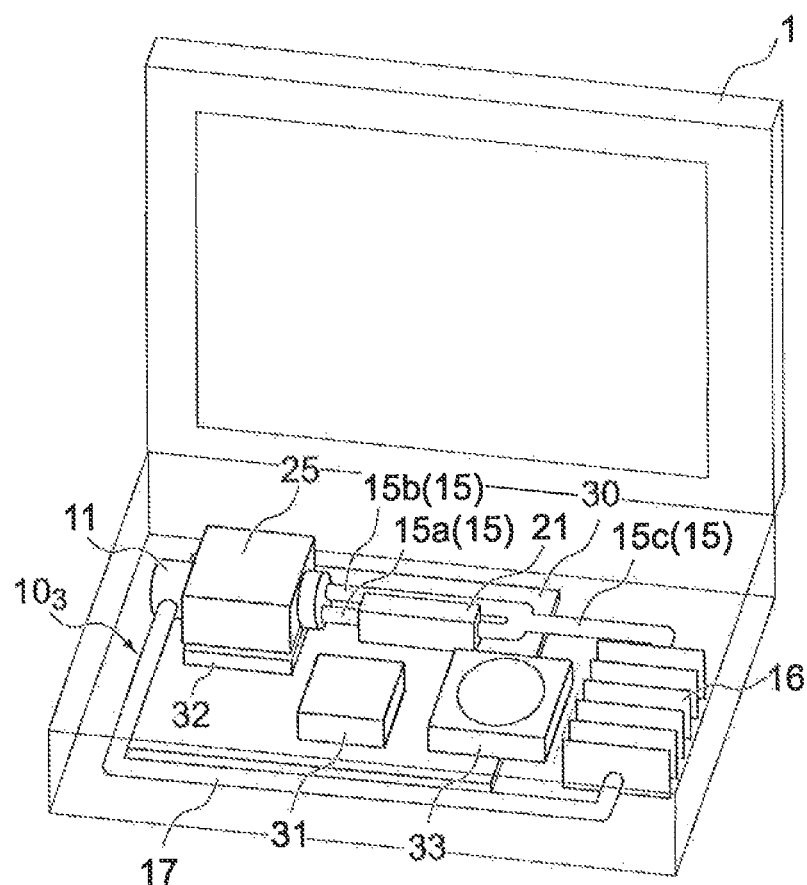
FIG. 13 is a block diagram illustrating an information processing apparatus according to a third embodiment.
Figure 14:
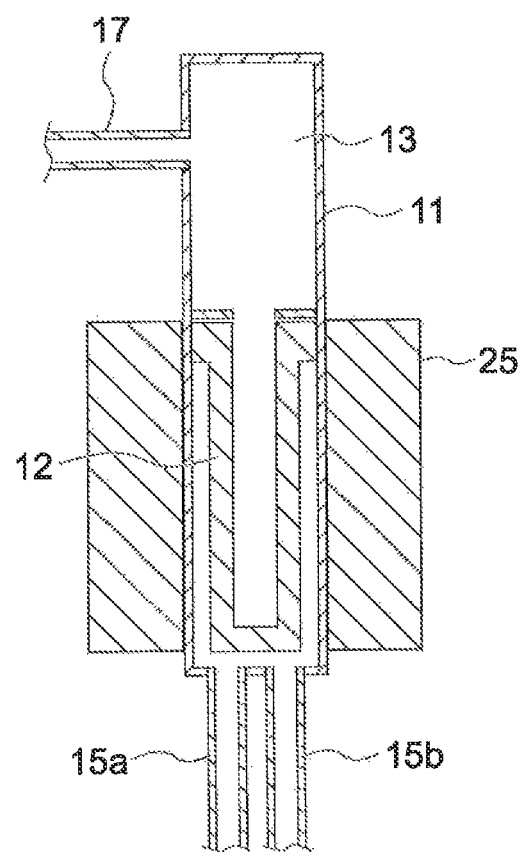
FIG. 14 is an explanatory diagram illustrating an evaporator in a loop heat pipe equipped in the information processing apparatus according to the third embodiment.

As schematically illustrated in FIG. 13, the third information processing apparatus 1 is also a so-called notebook PC, and is equipped with the printed circuit board 30, an LHP $10_3$, etc.

The LHP $10_3$ is, similar to the LHP $10_1$ (refer to FIGS. 1 and 5), a heat transport device that includes the evaporator 11, a condenser 16, and the vapor line 15 and the liquid line 17 each connecting the evaporator 11 with the condenser 16 to form a closed loop. The LHP $10_3$ also includes a predetermined amount of a working fluid enclosed therein.

The evaporator 11 and the liquid line 17 of the LHP $10_3$ are the same as the evaporator 11 and the liquid line 17 of the LHP $10_1$, respectively. The vapor line 15 of the LHP $10_3$ is a manifold that consists of main line 15c, and the two branch lines 15a and 15b branched off from the main line 15c. The vapor line 15 is fabricated by using copper pipes each having an outside diameter of 4 mm and an inside diameter of 3 mm as the main line 15c and branch lines 15a and 15b.

The evaporator 11 of LHP $10_3$ is essentially the same as the evaporator 11 of LHP $10_1$. However, the evaporator 11 (refer to FIGS. 13 through 15) of the LHP $10_3$ is a unit connected to the branch lines 15a and 15b of the vapor line 15 (a unit having two connecting parts for the vapor line 15).

The evaporator 11 (FIG. 13) of the LHP $10_3$ is located above the CPU 32 on the printed circuit board 30. The body part of the evaporator 11 is enveloped in the heat-receiving block 25 that consists from a high thermal conductive material (in this embodiment, copper), and the heat-receiving block 25 is fixed to the upper surface of the CPU 32.

Figure 15:
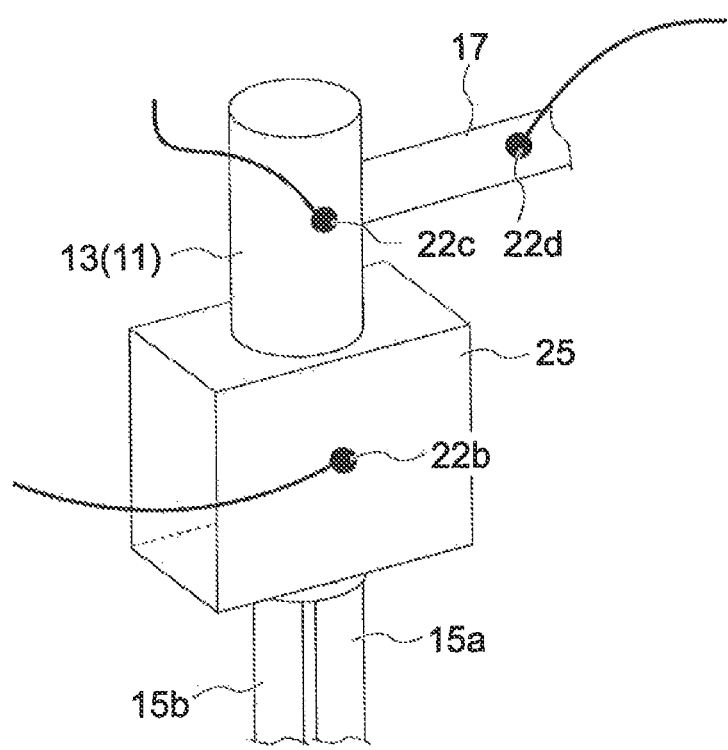
FIG. 15 is an explanatory diagram illustrating an attachment position of a temperature sensor near the evaporator of the information processing apparatus according to the third embodiment.

As illustrated in FIG. 15, the temperature sensor 22c for measuring temperature of the reservoir 13 is attached to the evaporator 11. Moreover, to the surface of the heat-receiving block 25 that is in contact with the CPU 32, the temperature sensor 22b for measuring temperature of the body part of the evaporator 11 (temperature of the CPU 32) is attached. Furthermore, to a part of the liquid line 17 near the evaporator 11 (in the present embodiment, a part located 30 mm apart from the end of the liquid line 17 connected to the evaporator 11), the temperature sensor 22d for measuring temperature of the part is attached.

Figure 16:
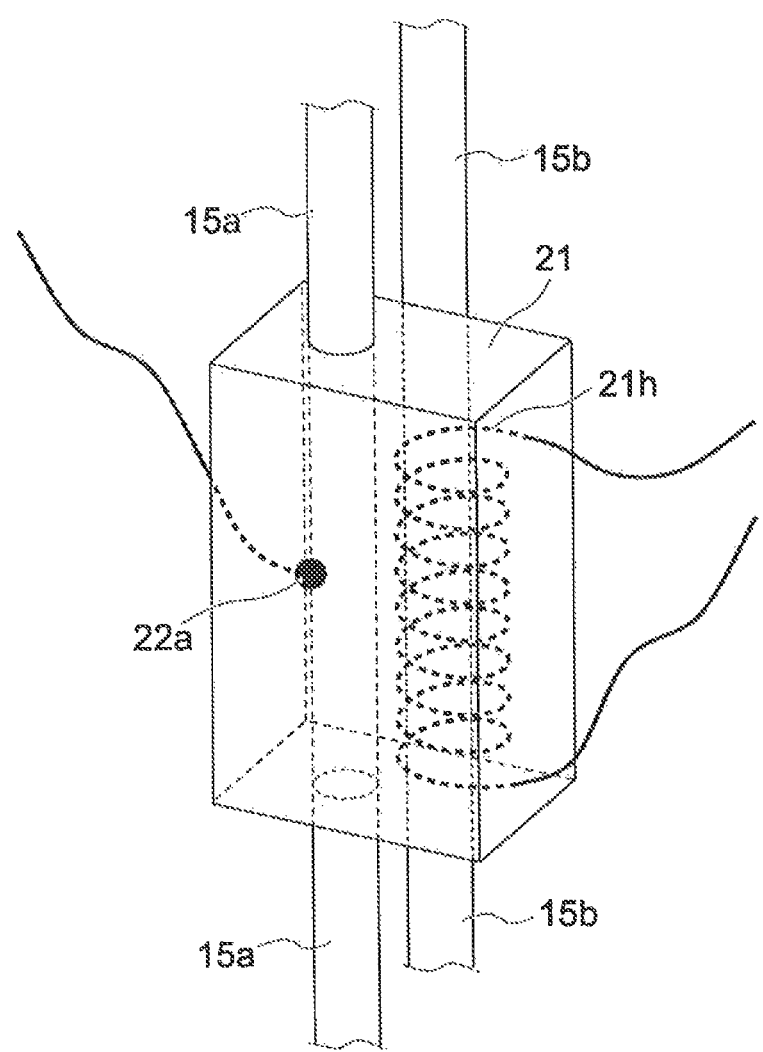
FIG. 16 is an explanatory diagram illustrating a heating device attached to a vapor line of the information processing apparatus according to the third embodiment.
Figure 17:
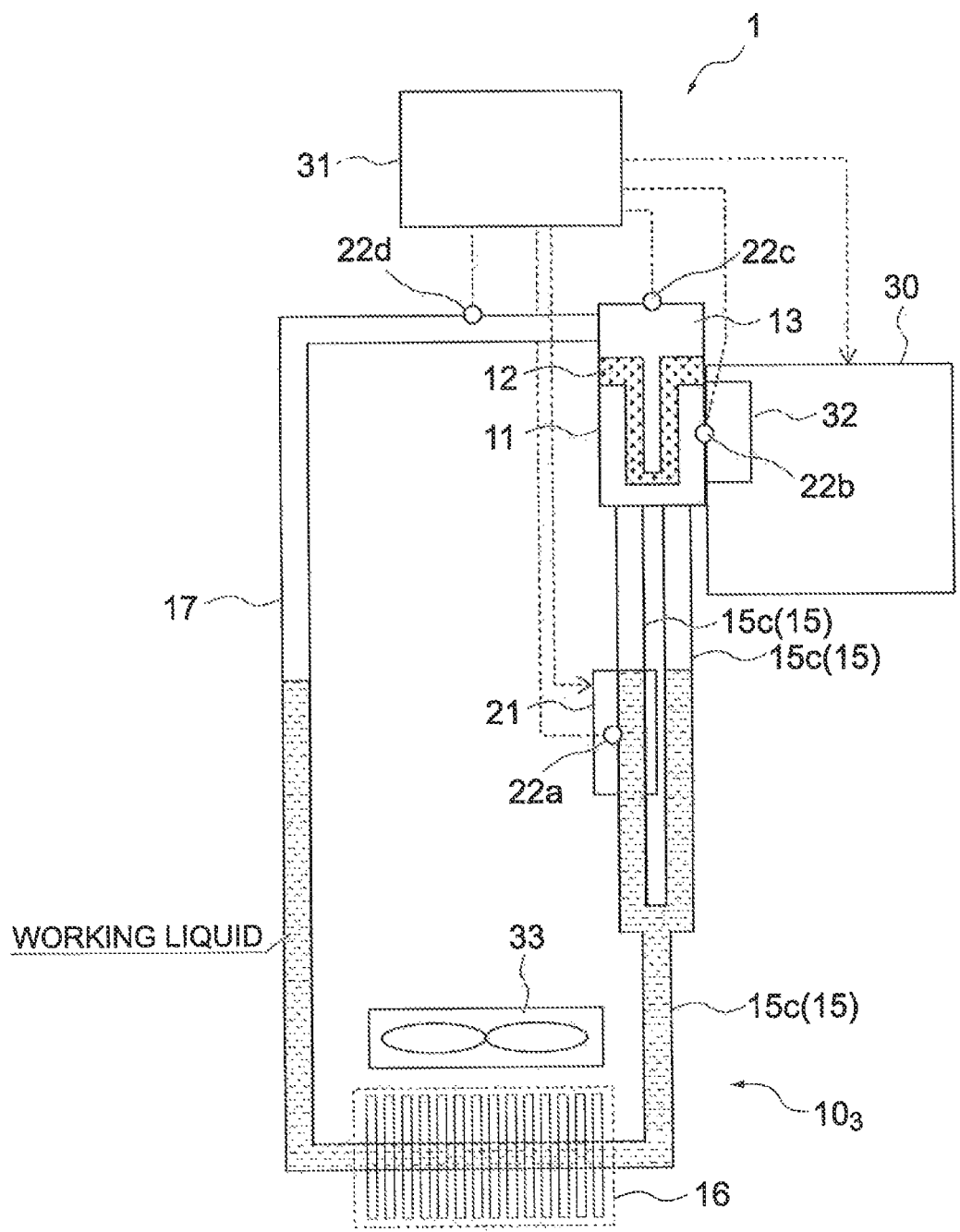
FIG. 17 is a simplified block diagram illustrating the information processing apparatus according to the third embodiment.

The heating device 21 is attached to the branch line 15a (FIG. 13) of the vapor line 15. As illustrated in FIG. 16, this heating device 21 is a unit that includes a member made of a high thermal conductive material (in this embodiment, a member which is made of copper and the length of which in the direction of the length of the vapor line 15 is about 50 mm) and the heater 21h embedded in the member. Further, as illustrated in the same figure, to the part of the vapor line to which the heating device 21 is attached, the temperature sensor 22a for measuring temperature of the part (hereafter referred to as the heating target part) is attached.

The shape of the vapor line 15 is determined so that the condition schematically illustrated in FIG. 5 is achieved when all the working fluid is gathered in the condenser-side of the LHP $10_3$ by turning the condenser 16 of the LHP $10_3$ vertically down. That is, the shape of the vapor line 15 is determined so that the branch point of the vapor line 15 is higher than the surface of the working liquid in the vapor line 15 when all the working liquid is gathered on the condenser-side within the LHP $10_1$ by turning the condenser 16 vertically down.

Further, the heating device 21 is attached to the branch line 15a so that its evaporator-side surface roughly matches with the above-mentioned surface of the working liquid.

The printed circuit board 30 provided in the third information processing apparatus 1 is the same as the printed circuit board 30 provided in the first information processing apparatus 1.

Figure 18:
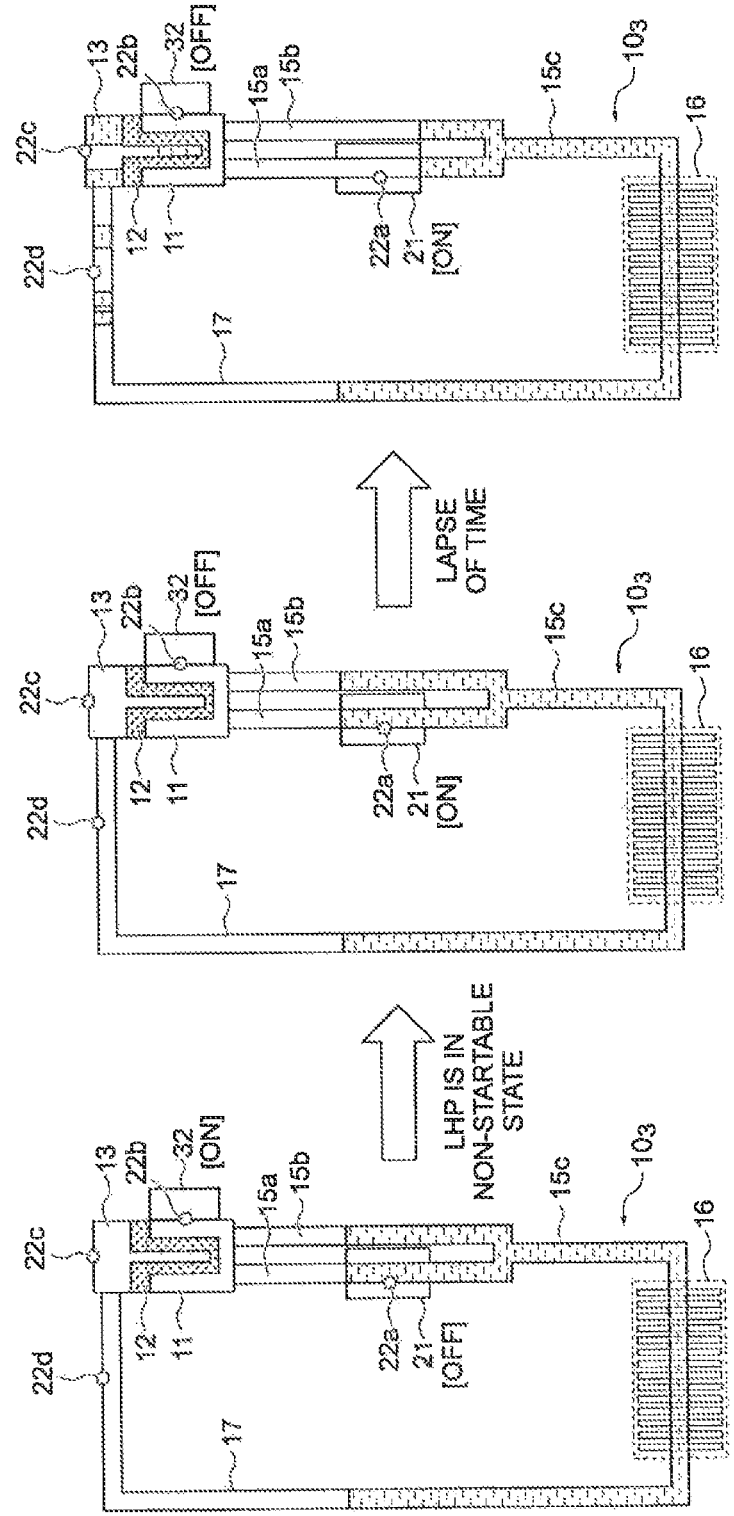

That is, on the printed circuit board 30 (refer to FIGS. 13 and 17) in the third information processing apparatus 1, the control device 31 electrically connected with the heating device 21 and the temperature sensors 22a through 22d is mounted. Further, this control device 31 performs, when the third information processing apparatus 1 is started, the activating process (refer to FIG. 6) already discussed. Consequently, if the LHP $10_3$ is in the non-startable state on boot of the third information processing apparatus 1, the control device 31, as schematically illustrated in FIG. 18, stops the operation of the CPU 32 once and then starts supplying power to the heating device 21.

When supplying power to the heating device 21 is started and a certain time has passed, working liquid vapor in the evaporator 11 and/or the parts of the liquid line 17 near the evaporator 11 condenses, similar to the case of the first information processing apparatus 1 (refer to FIG. 9). And when vapor portions of the working liquid condense (refer to FIG. 7), temperature Tb through Td of the parts in which vapor portions of the working liquid condense rise by about 1 to 5° C. owing to heat evolved when vapor portions condense. Moreover, although the increase rate of the temperature Ta of the heating target part is lowered, the control device 31 has a function of stopping supplying power to the heating device 21 and then restarting the CPU 32 when such a temperature change occurs (refer to FIG. 6)

Therefore, this third information processing apparatus 1 also functions as an apparatus that can start the LHP $10_3$ in the non-startable state efficiently (in a way that can prevent energy more than needed from being consumed by heating of the vapor line and/or the start timing of the cooling target from being overdue more than needed).

Furthermore, the evaporator 11 and the condenser 16 of the LHP $10_3$ are connected via the branch line 15a that is heated by the heating device 21 and the branch line 15b that is not heated by the heating device 21. Therefore, it can be said that the third information processing apparatus 1 is an apparatus, the LHP $10_3$ in which can start up more quickly (in a shorter time) than the first information processing apparatus 1.

Figure 19:
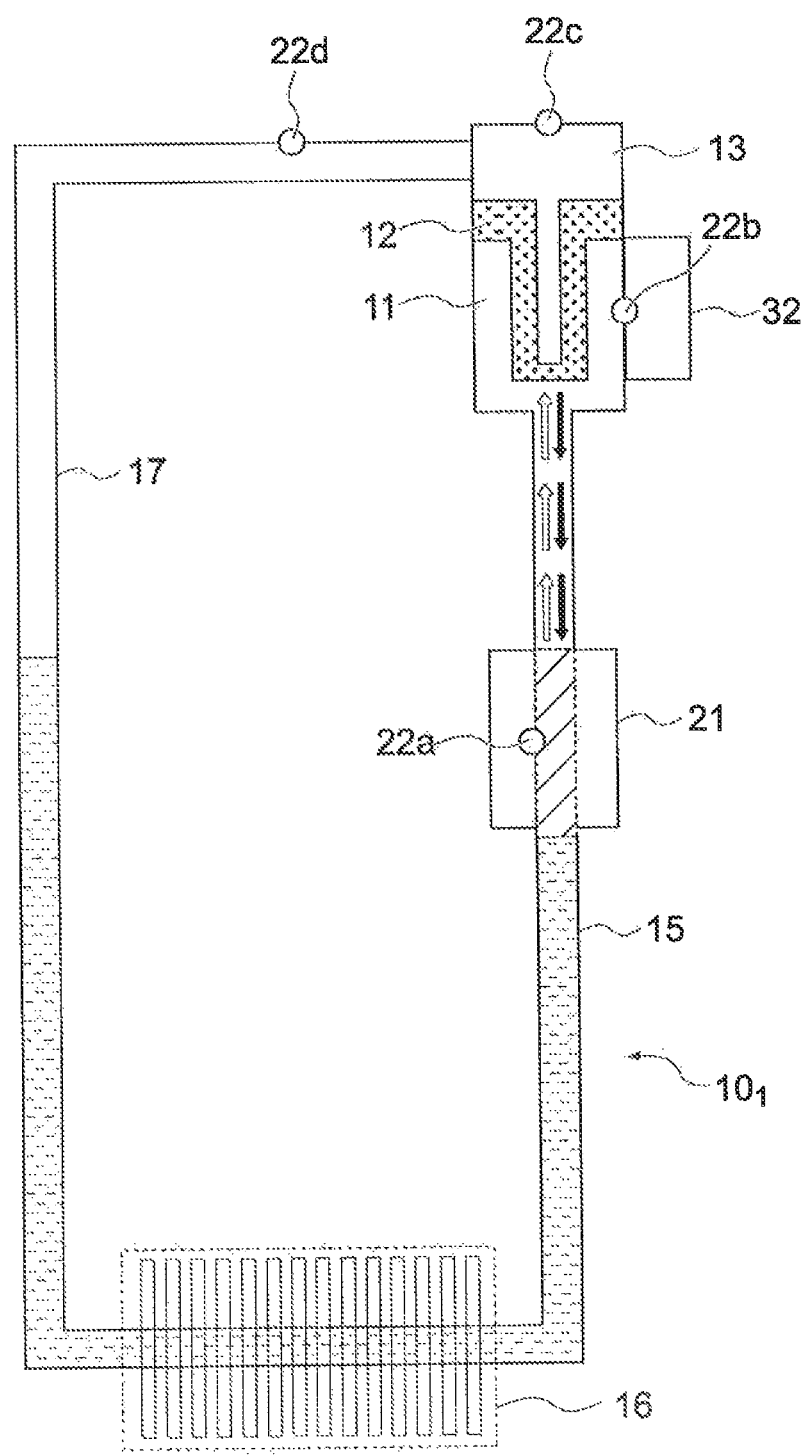
FIG. 19 is an explanatory diagram illustrating how to flow vapor through the loop heat pipe in the information processing apparatus according to the first embodiment.

Specifically, the evaporator 11 and the condenser 16 of the LHP $10_1$ are connected via the sole vapor line 15. Therefore, as schematically shown in FIG. 19, when the vapor line 15 of the LHP $10_1$ is heated, the flow (black arrows) of the working liquid vapor at a low temperature from the outlet side of the evaporator 11 obstructs the smooth flow (void arrows) of the working liquid vapor at a high temperature toward the wick 12 of the evaporator 11.

Figure 20:
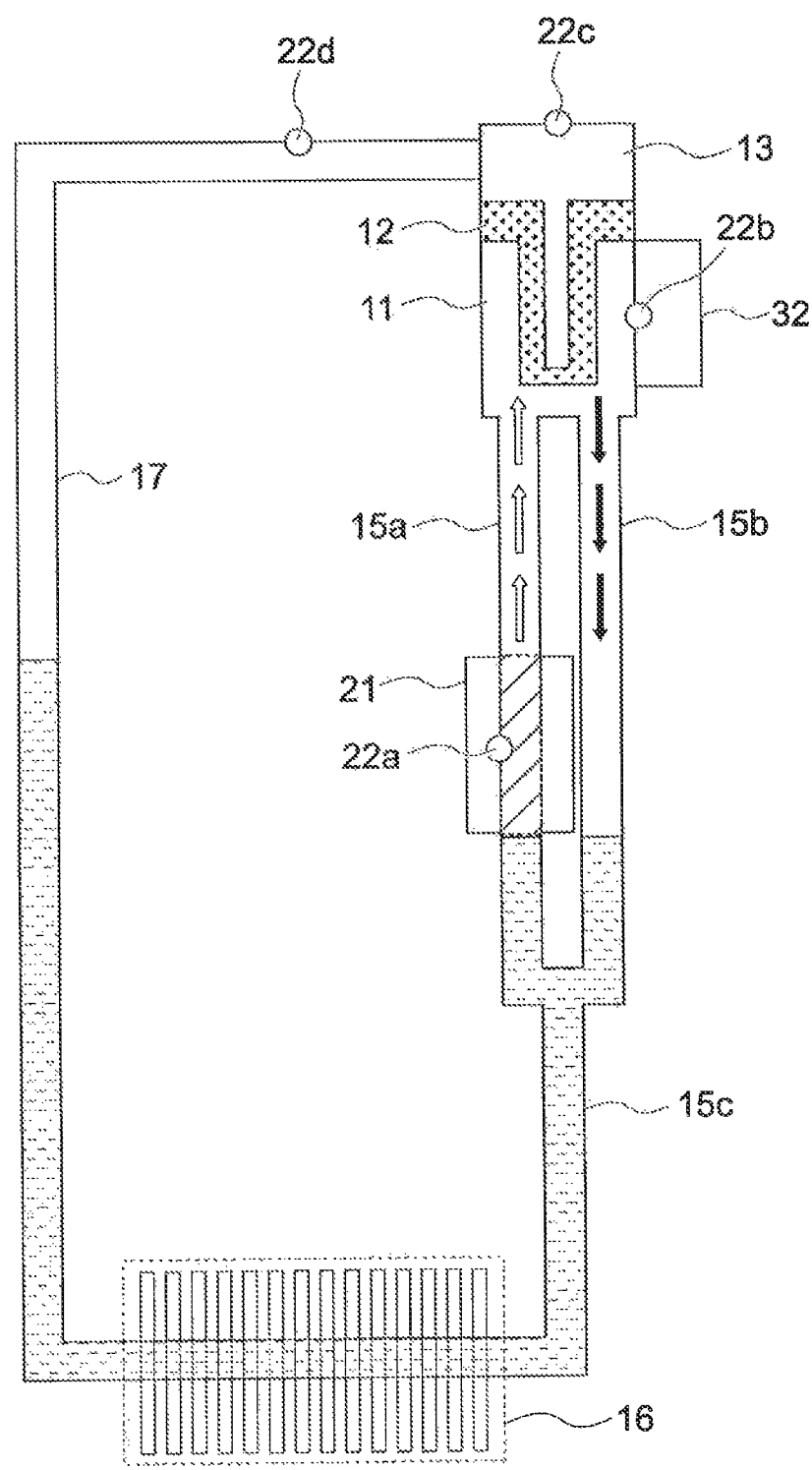
FIG. 20 is an explanatory diagram illustrating how to flow vapor through the loop heat pipe in the information processing apparatus according to the third embodiment.
Figure 21:
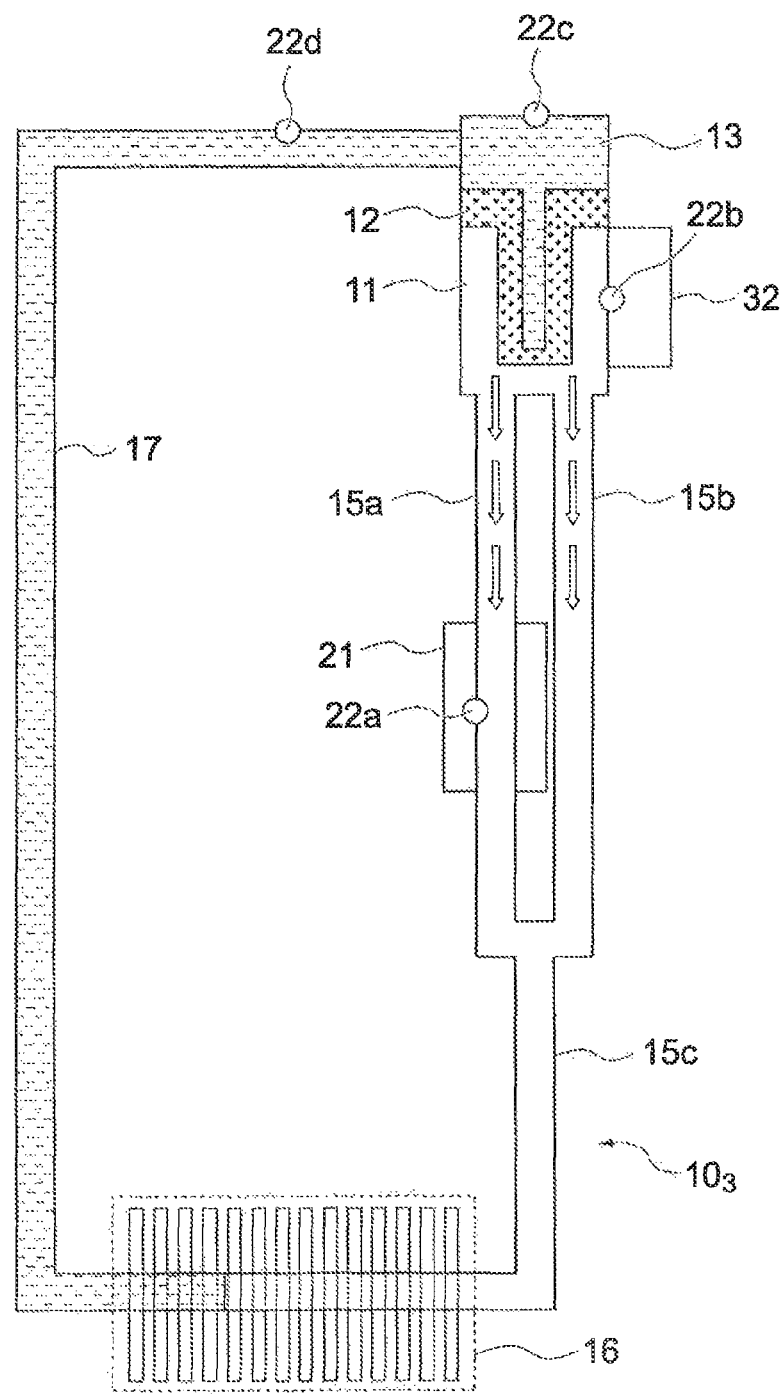
FIG. 21 is an explanatory diagram illustrating how to flow vapor through the loop heat pipe in the information processing apparatus according to the third embodiment.

On the other hand, the evaporator 11 and the condenser 16 of the LHP $10_3$ are connected via the branch line 15a that is heated by the heating device 21 and the branch line 15b that is not heated by the heating device 21. Therefore, as schematically shown in FIG. 20, when the vapor line 15 (the branch line 15a) of LHP $10_3$ is heated, the high-temperature working liquid vapor generated in the heating target part flows toward the evaporator 11 through the branch line 15a and the low-temperature working liquid vapor from the evaporator 11 flows toward the condenser 16 through the branch line 15b.

Herein, the smoother the working liquid vapor generated by heating flows toward the evaporator 11, the more quickly the working liquid vapor condenses. Therefore, the third information processing apparatus 1 functions as an apparatus, the LHP $10_3$ ($10_1$) in which can start up in a shorter time than the first information processing apparatus 1.

Note that, startup tests (power supplied to the heating device 21 is 10 W) of the first and third information apparatus 1, which are performed by turning the condenser 16 vertically down, revealed that the startup time of the LHP $10_1$ whose evaporator 11 is completely dried out is about thirty seconds and the startup time of the LHP $10_3$ whose evaporator 11 is completely dried out is about ten seconds. It can be therefore said that the above-mentioned architecture employed in the third information processing apparatus 1 is effective in shortening of startup time of LHPs.

Figure 22:
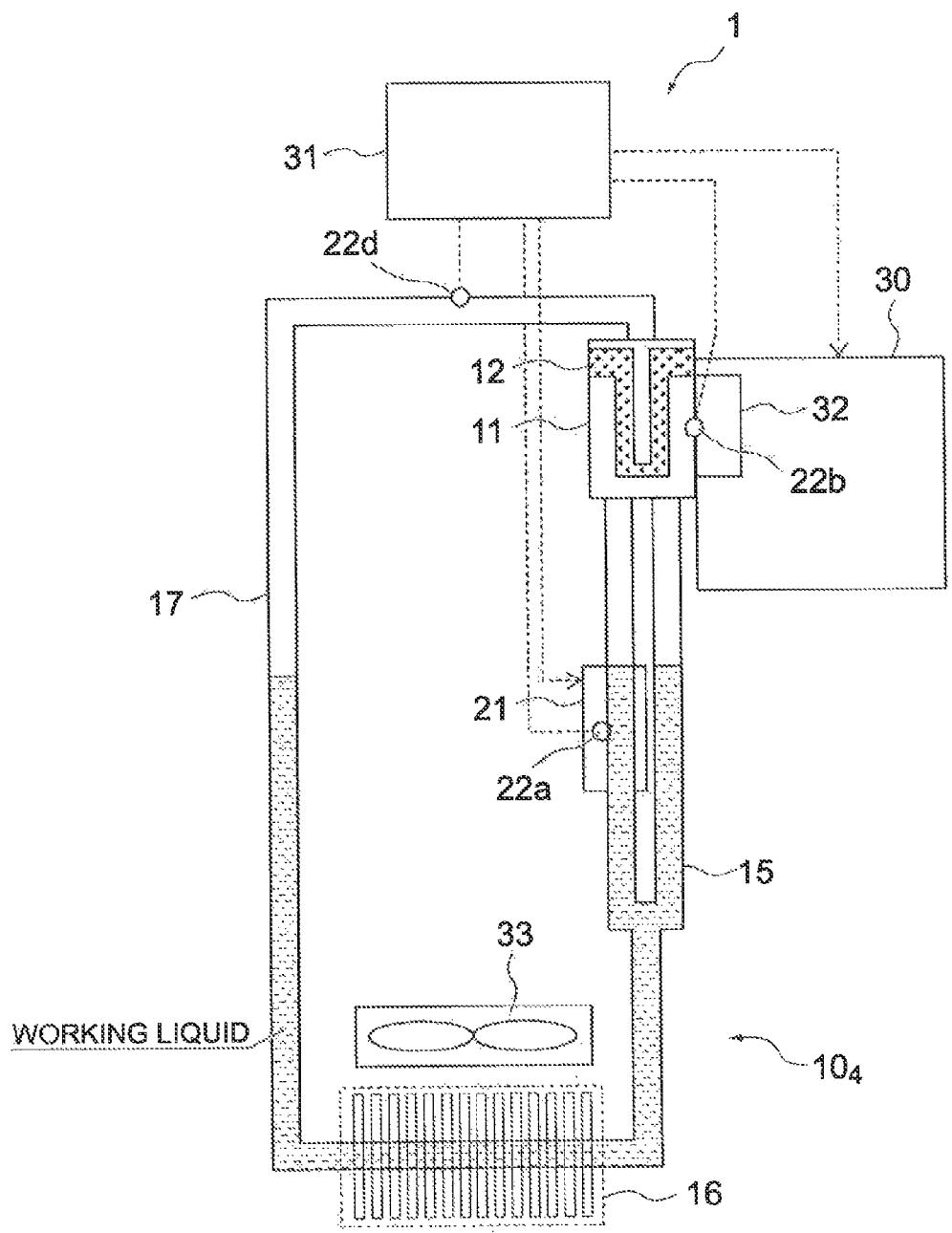
FIG. 22 is a simplified block diagram illustrating an information processing apparatus according to a forth embodiment.

Moreover, the vapor line 15 of the LHP $10_3$ has a part whose cross section area is larger than that of the vapor line of the LHP $10_1$. In other words, as schematically illustrated in FIG. 22, the LHP $10_3$ has such a configuration that the working liquid vapor from the evaporator 11 flows easily. Therefore, the LHP $10_3$ exhibits the higher operational stability after being started up.

Fourth Embodiment

A configuration and an operation of an information processing apparatus 1 according to a fourth embodiment (which is hereinafter termed the fourth information processing apparatus) will be explained.

As schematically illustrated in FIG. 22, the fourth information processing apparatus 1 is an apparatus that includes an LHP $10_4$ for cooling the CPU 32, the heating device 21, the control device 31, etc.

Similarly to the first through third information processing apparatuses 1 mentioned above, this fourth information processing apparatus 1 is a so-called notebook PC. As obvious from a comparison between FIGS. 22 and 17, the LHP $10_4$ in the fourth information processing apparatus 1 corresponds to the LHP $10_3$ having an evaporator 11' instead of the evaporator 11.

Figure 23:
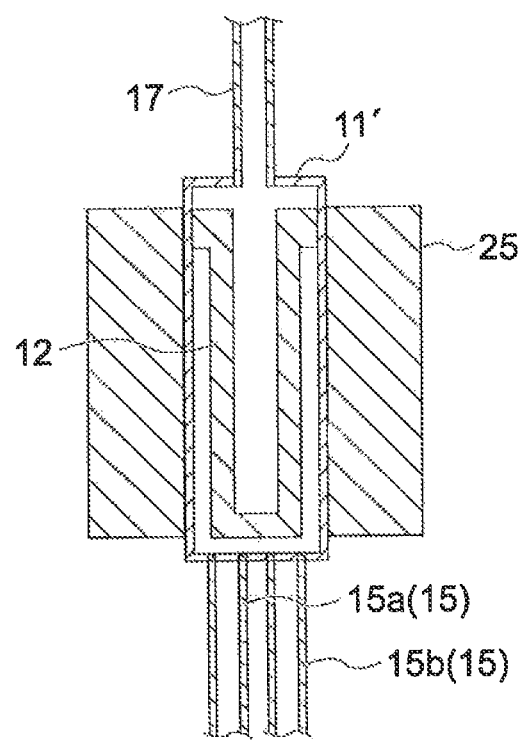
FIG. 23 is an explanatory diagram illustrating an evaporator in a loop heat pipe equipped in the information processing apparatus according to the fourth embodiment.

The evaporator 11' employed in the LHP $10_4$ is essentially the same as the evaporator 11' employed in the LHP $10_2$ (refer to FIGS. 10 and 11). However, as shown in FIG. 23 (and FIG. 22), the evaporator 11' of the LHP $10_4$ is a device that is connected to both of the branch lines 15a and 15b of the vapor line 15 (a device having two parts for connecting the vapor line 15).

Figure 24:
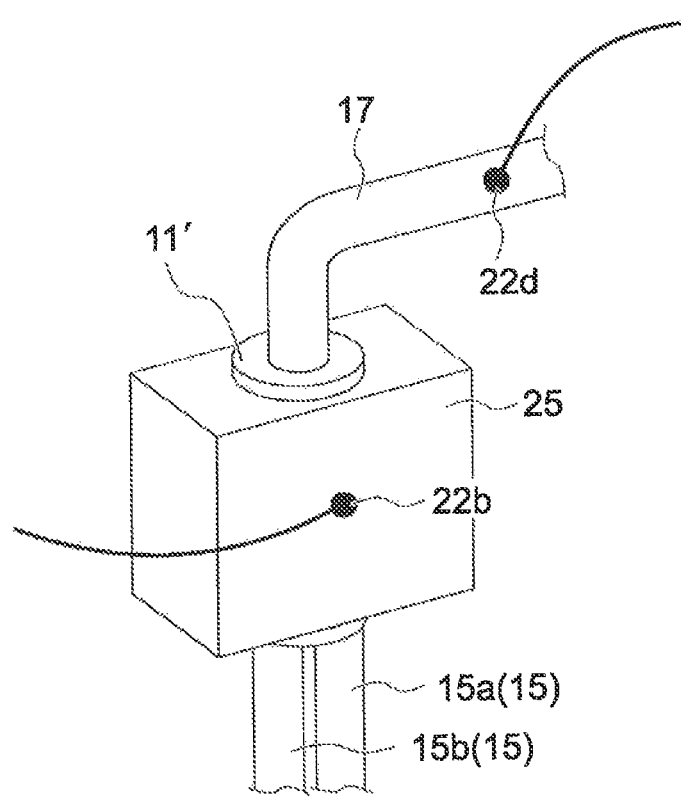
FIG. 24 is an explanatory diagram illustrating an attachment position of a temperature sensor near the evaporator of the information processing apparatus according to the fourth embodiment.

Further, to the evaporator 11' of the fourth information processing apparatus 1, as illustrated in FIG. 24, a sensor corresponding to the temperature sensor 22c (refer to FIG. 3) is not attached. Moreover, on the printed circuit board 30 of the fourth information processing apparatus 1, the control device 31 having the same function as that of the control device 31 in the second information processing apparatus.

In short, the fourth information processing apparatus 1 has such a configuration that the evaporator 11 in the third information processing apparatus 1 is altered to the evaporator 11', and components and capability that become unnecessary as a result of the alternation are removed from the third information processing apparatus 1.

Further, even if Tc cannot be measured, so long as Ta, etc can be measured, it is possible to detect that the state of LHP $10_4$ changed into the startable state. Therefore, it can be said the information processing apparatus 1 according to this fourth embodiment is also an apparatus, the LHP $10_3$ in which can start up efficiently.

Modified Examples

Each of the information processing apparatuses 1 according to the embodiments discussed above can be modified in a variety of forms. For example, each of the information processing apparatuses 1 according to the embodiments can be modified into a tower PC, the evaporator 11 (11') in which is arranged at a position higher than the condenser 16. Note that, in a case where the information processing apparatus 1 is modified into such a tower PC, the state of the LHP 10 in the modified information processing apparatus 1 when booted will be usually (unless it is rebooted in a short time) the non-startable state. Therefore, in this case, the control device 31 that performs "a startup process that makes the heating device 21 function before the CPU 32 is started" can be adopted.

Moreover, a peltier element (s) can be used instead of the heating device 21 having the heater 21h (FIG. 4). Incidentally, when using the peltier element instead of the heating device 21, it is possible to configure the information processing apparatus so that heating of the heating target part of the vapor line 15 and cooling the part of the liquid line 17 near the evaporator 11 (11') are performed by one peltier element by contriving the shapes of the vapor line 15 and the liquid line 17.

Figure 25:
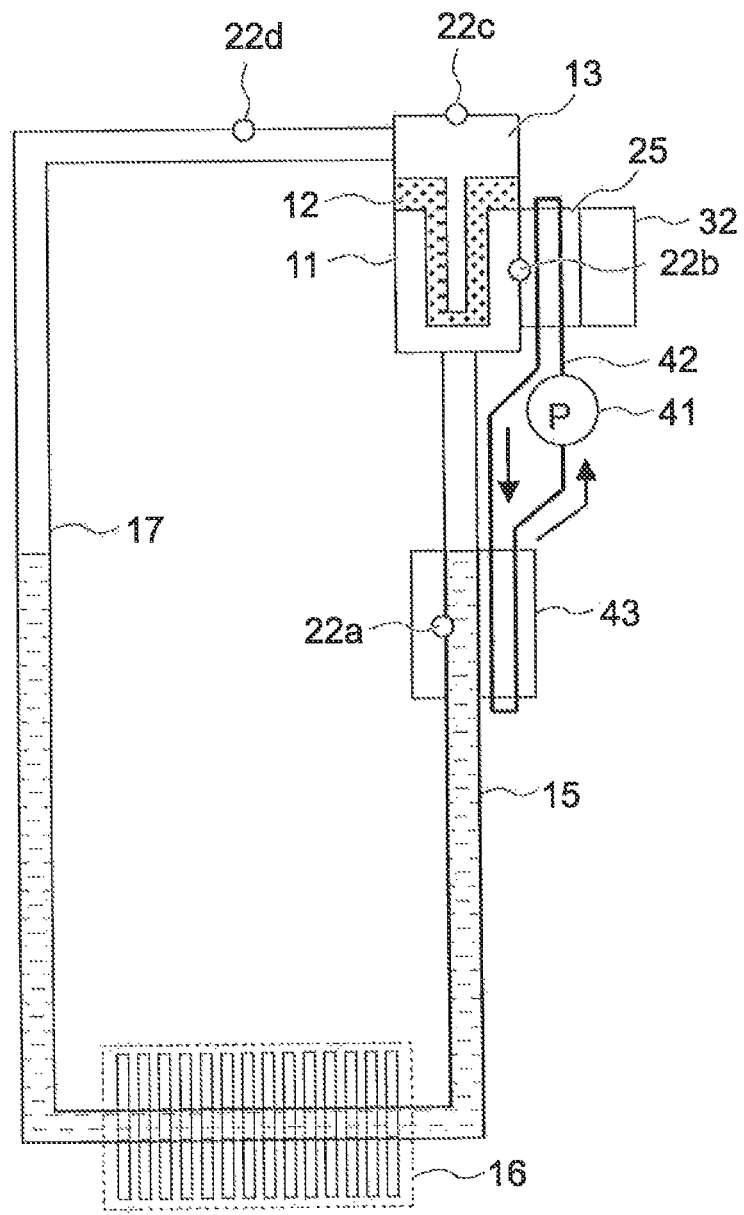
FIG. 25 is an explanatory diagram illustrating a device that can be used as the heating device.

Furthermore, as schematically illustrated in FIG. 25, it is possible to attach to the heating target part of the vapor line 15 a member 43 of high heat conductivity instead of the heating device 21, and add to the LHP a heating medium circulating path 42 that includes a pump 41 and is for transporting heat from the heat receiving block 25 to the member 43.

Moreover, a requirement for the attachment part of each temperature sensor 22x (x=a through d) is only that the working fluid portion in the part has different phases in the situation where the LHP 10 functions as a heat transfer device and in the situation where the LHP 10 does not function as a heat transfer device and there is no working liquid in the evaporator 11 (11').

Figure 26:
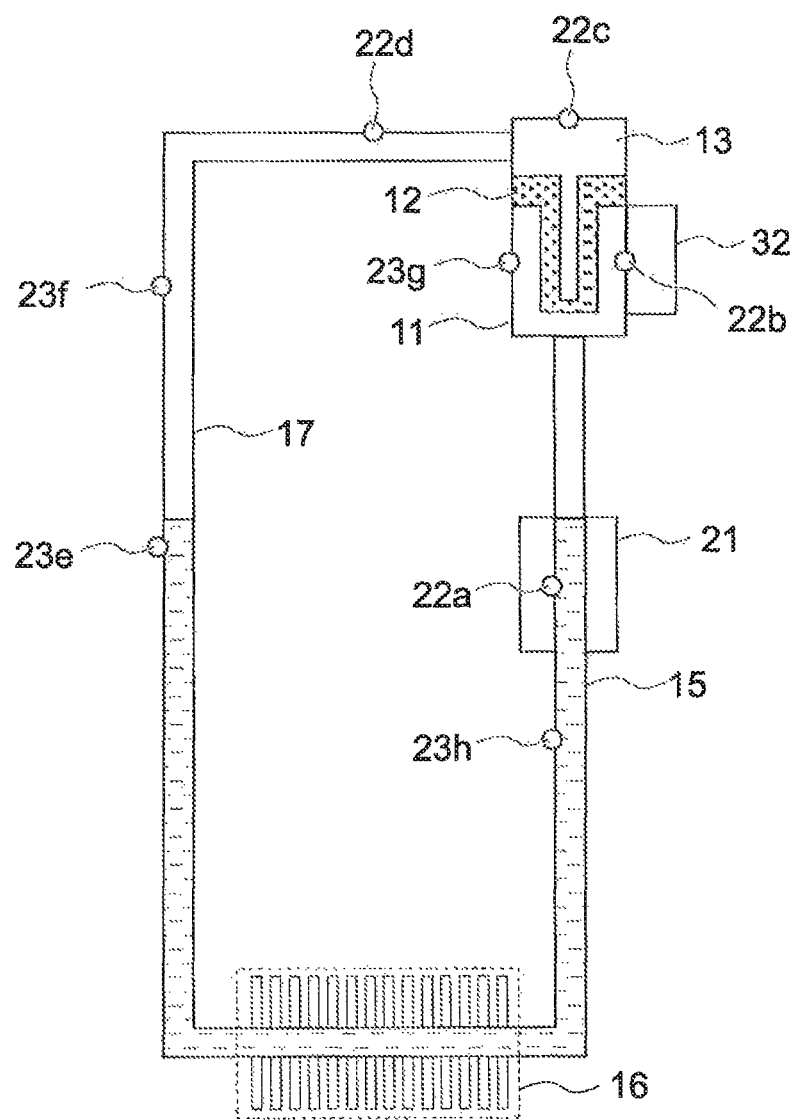
FIG. 26 is a simplified block diagram illustrating an information processing apparatus used for experiments.
Figure 27A:
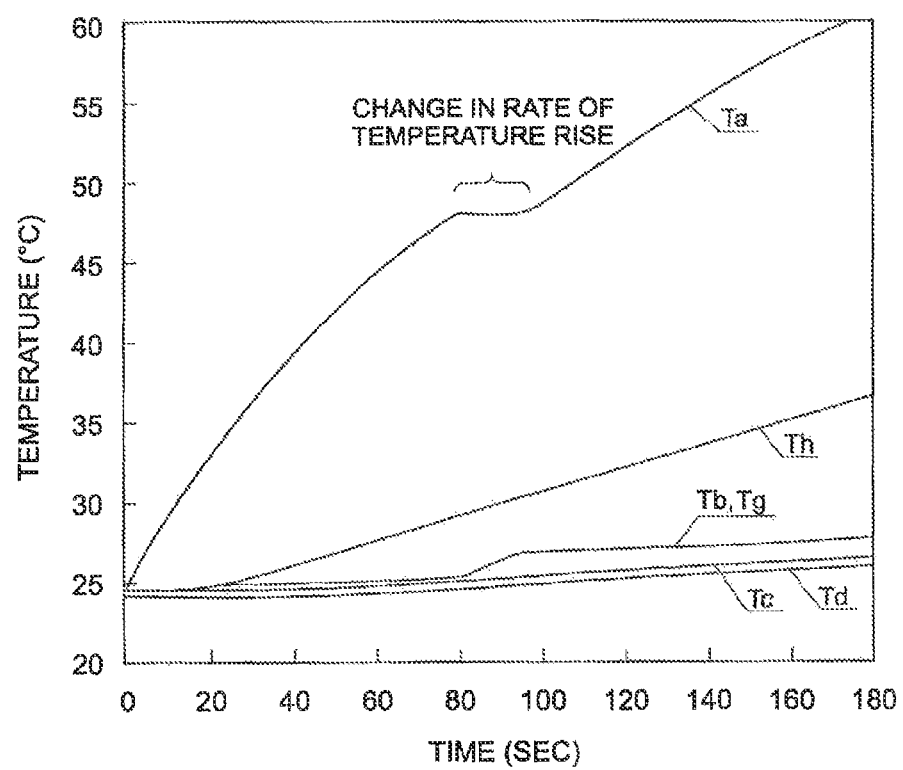
FIG. 27A is an explanatory diagram illustrating experimental results.
Figure 27B:
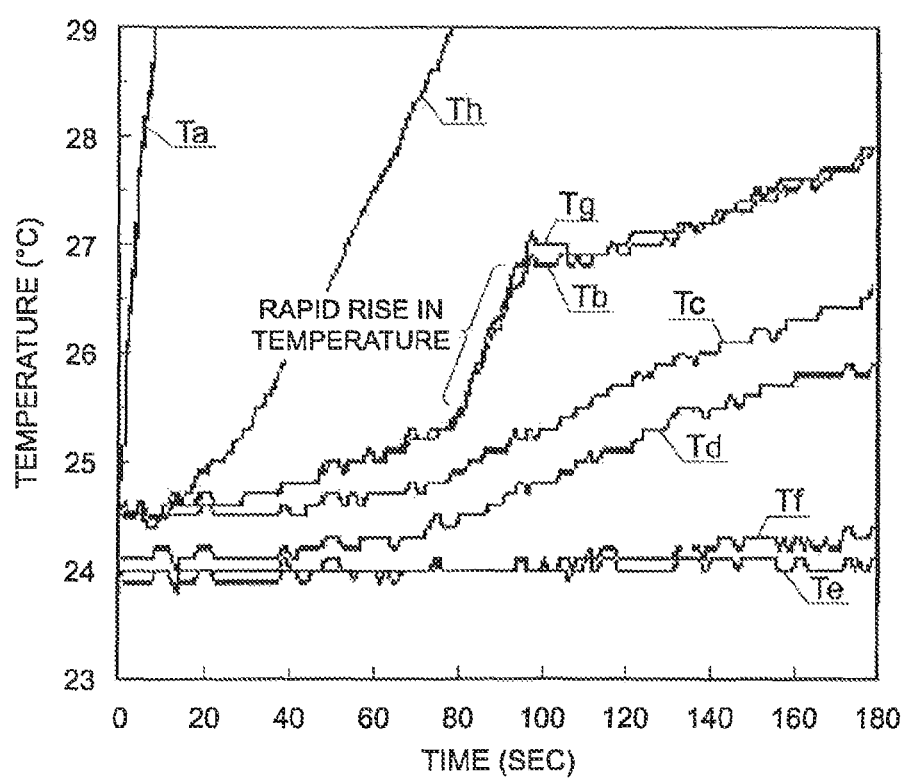
FIG. 27B is an explanatory diagram illustrating experimental results.

More specifically, experiments performed on an LHP, size of which is larger that of the above-mentioned LHP and to which eight temperature sensors 22a through 22h are attached as illustrated in FIG. 26, yielded results illustrated in FIGS. 27A and 27B. Note that, in FIGS. 27A and 27B, Ta through Te are the temperature measured by the temperature sensors 22a through 22h, respectively.

These results reveal that it is difficult to detect condensation of the working liquid vapor from the temperature Te or Tf that is the temperature of the part of the liquid line 17 apart from the evaporator 11, but it is possible to detect condensation of the working liquid using the temperature Ta of the heating target part or the temperature Tb, Tc, Td or Tg of the parts near the evaporator 11.

It is therefore desirable that each temperature sensor 22x (x=a through d) is attached to the part, the state of the working fluid portion in which differs in the two above-mentioned situations, especially, the heating target part or the part neat the evaporator 11.

Note that, a requirement for the temperature of each part of the LHP 10 (the LHP $10_1$, $10_2$, $10_3$ or $10_4$) measured by each temperature sensor 22x is merely that it corresponds (relates) to the temperature of the working fluid in each part. Therefore, it is not necessary to attach each temperature sensor 22x to a wall of each line (refer to FIG. 3) or the like.

It is possible to arrange the temperature sensor 22x (the part the temperature sensor 22x which actually measures temperature; the tip point of the thermoelectric couple, etc.).

Moreover, although the information processing apparatus 1 according to each embodiment has multiple temperature sensors 22x attached to the LHP 10, it is possible to judge whether the state of the LHP 10 changed into the startable state from the measurement result of the temperature by the sole temperature sensor 22x. Consequently, the information processing apparatus 1 according to each embodiment can be modified into the apparatus having the LHP 10 to which only one temperature sensor 22 is attached. Incidentally, the amounts of temperature change resulting from condensation of the working liquid vapor (the amounts of change ratio in temperature) become small in the order of Ta, Tb, Tc, and Td (refer to FIG. 7). Therefore, when attaching only one temperature sensor 22x to the LHP 10, it is desirable to attach only the temperature sensor 22a for measuring temperature of the heating target part.

Moreover, the above-mentioned completion-of-startup monitoring process is the process that judges whether the state of the LHP 10 is the startable state or not based on the change ratios of Ta through Td. The details of the completion-of-startup monitoring process can be altered according to the temperature change actually occurred due to the condensation of the working fluid vapor.

Figure 28:
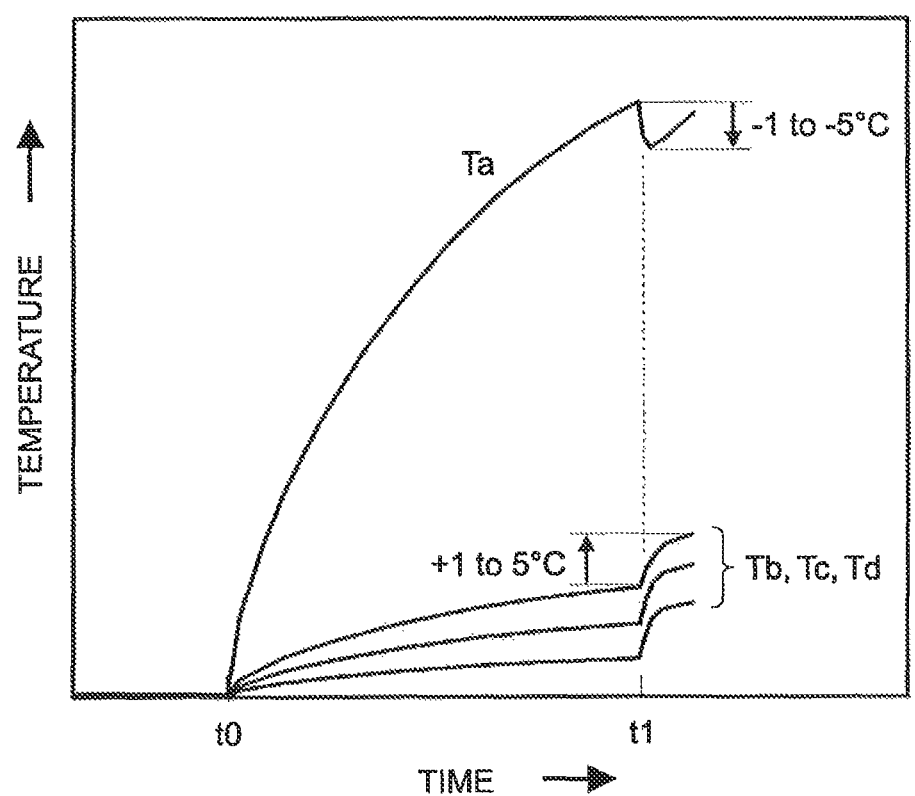
FIG. 28 is an explanatory diagram illustrating changes in temperature of each part of the loop heat pipe when the heating target part of the vapor line is heated.

Specifically, there are cases where Ta, Tb, Tc and Td changes illustrated in FIG. 28, depending on the configuration of the LHP 10 (size of each component (vapor line, etc.), the positional relationship between the components of the LHP 10 on the printed circuit board 30). In cases where Ta, Tb, Tc and Td changes in this manner, it is possible to adopt the completion-of-startup monitoring process that periodically measures Ta, manages the maximum value of Ta, and judges that the state of the LHP 10 becomes the startable state when Ta equal to or lower than the value of "the managing maximum value $-\alpha$" ($\alpha$ is, for example, 3° C.) is measured. Note that, in this case, as might be expected, it is also possible to adopt the completion-of-startup monitoring process that judges whether the state of the LHP 10 is the startable state or not based on the change ratios of Ta through Td.

Furthermore, the completion-of-startup monitoring process can be altered a process of judging that the state of the LHP becomes the startable state when Ta reaches a temperature (for example, 50° C.) that ensures the condensation of the working liquid vapor occurs, although it follows that more energy than is needed is consumed to heat the vapor line 15.

It is also possible to modify each LHP 10 into a device having one or more evaporators 11 (11') connected in parallel with the evaporators 11 (11') (a device having multiple evaporators 11 (11') each inserted between the vapor line 15 and the liquid line 17). Moreover, it is possible to modify each of the LHP 102 and 104 into a device including the vapor line 15 having three or more branch lines.

Furthermore, the information processing apparatus 1 (the notebook PC) can be modified into such devices that manages whether there exists working liquid in the evaporator 11 or not (whether heating of the vapor line 15 is required or not when being booted) by detecting attitudes of the self-apparatus using an accelerometer while the LHP 10 does not operate.

INDUSTRIAL APPLICABILITY

Disclosed technique can be used in the various fields for which cooling is needed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments) of the present invention have been described in detail, it should be understood that the various changes, substitutions, and alterations could be made hereto without departing from the spirit and scope of the invention.

What is claimed is:

1. A loop heat pipe system, comprising:
a loop heat pipe including an evaporator to evaporate a liquid phase of a working fluid by adsorbing heat from a heat source, a condenser to condense a vapor phase of the working fluid by radiating heat, a vapor line to feed the working fluid from the evaporator to the condenser, and a liquid line to feed the working fluid from the condenser to the evaporator, the working fluid having different phases depending on whether or not the loop heat pipe is in a non-startable state in which a heat transport of the loop heat pipe is not started up and a liquid phase of the working fluid does not exist in the evaporator;
a heater to heat a heating target part that is part of the vapor line;
a first temperature sensor to measure temperature of the heat target part;
a second temperature sensor to measure temperature of part of the loop heat pipe apart from the heat target part; and
a controller, in order to start up the heat transport of the loop heat pipe that is in the non-startable state, to turn on the heater, to monitor the temperature of the heat target part and the temperature of the part of the loop heat pipe apart from the heat target part by using the first temperature sensor and the second temperature sensor, to judge whether or not the loop heat pipe is in a startable state where the loop heat pipe starts up the heat transport upon detecting decline of a rate in increase of the temperature of the heating target part by a predetermined first value and rising of the temperature of the part of the loop heat pipe apart from the heating target part by a predetermined second value, and to turn off the heater when the loop heat pipe is in the startable state.

2. The loop heat pipe system according to claim 1, wherein the vapor line of the loop heat pipe is a member including a main line whose open end is connected to the condenser and multiple branch lines, branched off from the main line, whose open ends are connected to the evaporator, and
the heater heats one or more branch lines among the multiple branch lines.

3. The loop heat pipe system according to claim 1, further comprising one or more temperature sensors each to measure temperature of a specific part of the loop heat pipe,
wherein the controller monitors temperature measured by each temperature sensor, and turns off the heater when detecting a change caused by condensation of a vapor phase of the working fluid in any one of monitored temperatures.

4. The loop heat pipe system according to claim 1, wherein the first temperature sensor is attached to an intermediate position of the vapor line.

5. The loop heat pipe system according to claim 1, wherein the controller judges whether or not the loop heat pipe is in the startable state where the loop heat pipe starts up the heat transport without performing heating of the heating target part, and controls the heater when judging that the loop heat pipe is not in the startable state.

6. The loop heat pipe system according to claim 1, wherein the evaporator includes a reservoir to temporarily reserve a liquid phase of the working fluid.

7. The loop heat pipe system according to claim 1, wherein the heater heats, as the heating target part, part of the vapor line that lies below a surface of all liquid working fluid gathered on the condenser side within the loop heat pipe by inclining the loop heat pipe so that the condenser is situated vertically down.

8. The loop heat pipe system according to claim 1, wherein the heater is a device that includes a heating medium circulating path having a heating medium therein to transport heat from the heat source to the heating target part, and a pump, controlled by the controller, to circulate the heating medium through the heating medium circulating path.

9. An information processing apparatus, comprising:
an electronic component to be cooled in operation;
a loop heat pipe including an evaporator to evaporate a liquid phase of a working fluid by adsorbing heat from the electronic component, a condenser to condense a vapor phase of the working fluid by radiating heat, a vapor line to feed the working fluid from the evaporator to the condenser, and a liquid line to feed the working fluid from the condenser to the evaporator, the working fluid having different phases depending on whether or not the loop heat pipe is in a non-startable state in which a heat transport of the loop heat pipe is not started up and a liquid phase of the working fluid does not exist in the evaporator;
a heater to heat a heating target part that is part of the vapor line;
a first temperature sensor to measure temperature of the heat target part;
a second temperature sensor to measure temperature of the loop heat pipe apart from the heat target part;
a controller, in order to start up the heat transport of the loop heat pipe that is in the non-startable state, to turn on the heater, to monitor the temperature of the heat target part and the temperature of the part of the loop heat pipe apart from the heat target part by using the first temperature sensor and the second temperature sensor, to judge whether or not the loop heat pipe is in a startable state where the loop heat pipe starts up the heat transport upon detecting decline of a rate in increase of temperature of the heating target part by a predetermined first value and rising of the temperature of the part of the loop heat pipe apart from the heating target part by a predetermined second value, and to turn off the heater when the loop heat pipe is in the startable state.

10. The information processing apparatus according to claim 9, wherein the controller judges whether or not the loop heat pipe is in the startable state where the loop heat pipe starts up the heat transport without performing heating of the heating target part, and controls the heater when judging that the loop heat pipe is not in the startable state.

11. The information processing apparatus according to claim 10, wherein the controller further judges whether or not the loop heat pipe is in the startable state based on a pattern of temperature change of the electronic component after the electronic component starts its operation.

12. The information processing apparatus according to claim 10, wherein the controller halts operation of the electronic component when starting heating of the heating target part by the heater, and starts operation of the electronic component when stopping the heating of the heating target part by the heater.

13. The information processing apparatus according to claim 10, wherein the vapor line is a member including a main line whose open end is connected to the condenser and multiple branch lines, branched off from the main line, whose open ends are connected to the evaporator, and the heater heats one or more branch lines among the multiple branch lines of the loop heat pipe.

* * * * *